United States Patent
Leung

(10) Patent No.: US 6,449,685 B1
(45) Date of Patent: Sep. 10, 2002

(54) READ/WRITE BUFFERS FOR COMPLETE HIDING OF THE REFRESH OF A SEMICONDUCTOR MEMORY AND METHOD OF OPERATING SAME

(75) Inventor: Wingyu Leung, Cupertino, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/007,334

(22) Filed: Oct. 29, 2001

Related U.S. Application Data

(60) Division of application No. 09/405,607, filed on Sep. 24, 1999, which is a continuation-in-part of application No. 09/165,228, filed on Oct. 1, 1998, now Pat. No. 5,999,474.

(51) Int. Cl.[7] .............................................. G06F 12/00

(52) U.S. Cl. ....................................... 711/106; 711/160

(58) Field of Search ........................................... 711/106

(56) References Cited

U.S. PATENT DOCUMENTS

| 4,330,852 A | 5/1982 | Redwine et al. |
|---|---|---|
| 4,549,284 A | 10/1985 | Ikuzaki |
| 4,625,301 A | 11/1986 | Berger |

(List continued on next page.)

FOREIGN PATENT DOCUMENTS

| EP | 0588250 | 3/1994 |
|---|---|---|
| EP | 0794497 | 9/1997 |
| EP | 0811979 | 12/1997 |
| GB | 2265035 A | 9/1993 |
| WO | WO98/19309 | 5/1998 |

OTHER PUBLICATIONS

Toshiba Corporation, "Toshiba MOS Digital Integrated Circuit," Toshiba Integrated Circuit Technical Data, Toshiba Corporation, p. 1–18, ( Sep. 2, 1996).

Kazushige Ayukawa et al., "An Access–Sequence Control Scheme to Enhance Random–Access Performance of Embedded DRAM's," IEEE Journal of Solid–State Circuits, IEEE, vol. 33 ( No. 5), p. 800–806, ( Feb. 5, 1998).

16Mbit Synchronous DRAM, Revised 5/96, p. 1–100, IBM Corporation.

16Mbit Enhanced SDRAM Family 4Mx4, XMx8, 1Mx16, Enhanced Memory Systems, Inc., Enhanced Memory Systems, Inc. (Colorado Springs), p. 1–8, (Feb. 4, 1997).

Direct Rambus Technology Disclosure, 1997, pp. 1–48, Rambus, Inc.

(List continued on next page.)

*Primary Examiner*—Jack A. Lane
(74) *Attorney, Agent, or Firm*—E. Eric Hoffman; Bever, Hoffman & Harms, LLP

(57) ABSTRACT

A system for handling refresh of a DRAM array or other memory array requiring periodic refresh, such that the refresh does not require explicit control signaling between the memory array and a memory controller. External accesses and refresh operations are controlled so that the refresh operations do not interfere with the external accesses under any conditions. A multi-bank refresh scheme is used to reduce the number of collisions between external accesses and refresh operations. A read buffer buffers read data, thereby allowing refresh operations to be performed when consecutive read accesses hit the address range of the same memory bank for a long period of time. A write buffer buffers write data, thereby allowing refresh operations to be performed when consecutive write accesses hit the address range of a single memory bank for a long period of time. Both the read and write buffers can be constructed of DRAM cells.

16 Claims, 15 Drawing Sheets

U.S. PATENT DOCUMENTS

| | | | |
|---|---|---|---|
| 4,999,814 A | 3/1991 | Hashimoto |
| 5,033,027 A | 7/1991 | Anmin |
| 5,295,109 A | 3/1994 | Nawaki |
| 5,450,364 A | 9/1995 | Stephens, Jr. et al. |
| 5,471,601 A | 11/1995 | Gonzales |
| 5,511,033 A | 4/1996 | Jung |
| 5,544,120 A | 8/1996 | Kuwagata et al. |
| 5,559,750 A | 9/1996 | Dosaka et al. |
| 5,582,823 A | 12/1996 | Park |
| 5,586,287 A | 12/1996 | Okumura et al. |
| 5,642,320 A | 7/1997 | Jang |
| 5,659,515 A | 8/1997 | Matsuo |
| 5,721,862 A | 2/1998 | Sartore et al. |
| 5,748,547 A | 5/1998 | Shau |
| 5,784,705 A | 7/1998 | Leung |
| 5,802,555 A | 9/1998 | Shigeeda |
| 5,822,265 A | 10/1998 | Zdenek |
| 5,829,026 A | 10/1998 | Leung |
| 5,859,809 A | 1/1999 | Kim |
| 5,873,114 A | 2/1999 | Rahman et al. |
| 5,875,452 A | 2/1999 | Katayama et al. |
| 5,940,851 A | 8/1999 | Leung |
| 5,999,474 A | 12/1999 | Leung et al. |

OTHER PUBLICATIONS

Mbx4 Enchanced . . . , pp. 2–17 to 2–33, Ramtron Int'l. Corporation.

Dynamic CMOS Ram, pp. 6–101 to 6–113, NEC Electronics, Inc.

MD904 to MD920 . . . (1996) DS01–2.4–Feb. 21, 1997, MoSys, Inc.

Pentium Processor 3.3V Pipelined BSRAM Specification, Ver. 2.0, May 25, 1995, Intel Corporation.

SLDRAM Consortium, "400 Mb/s/pin SLDRAM", pp. 1–59 (author unknown).

READ/WRITE BUFFERS FOR COMPLETE HIDING OF THE REFRESH OF A SEMICONDUCTOR MEMORY AND METHOD OF OPERATING SAME

RELATED APPLICATIONS

The present application is a divisional application of continuation-in-part U.S. patent application Ser. No. 09/405,607, by Wingyu Leung entitled "Read/Write Buffers For Complete Hiding Of The Refresh Of A Semiconductor Memory And Method Of Operating Same" filed Sep. 24, 1999, which is a continuation-in-part of application Ser. No. 09/165,228 filed Oct. 1, 1998, now U.S. Pat. No. 5,999,474, by Wingyu Leung and Fu-Chieh Hsu issued Dec. 7, 1999.

The present application is further related to U.S. Pat. No. 6,028,804, by Wingyu Leung, entitled "Method and Apparatus for 1-T SRAM Compatible Memory"; U.S. Pat. No. 6,222,785, by Wingyu Leung, entitled "Method and Apparatus For Refreshing A Semiconductor Memory using Idle Memory Cycles"; and U.S. Pat. No. 6,075,740, by Wingyu Leung, entitled "Method and Apparatus for Increasing The Time Available for Refresh For 1-T SRAM Compatible Devices". These patents are hereby incorporated by reference.

FIELD OF THE INVENTION

The present invention is related to semiconductor memories, especially dynamic random access memory (DRAM) and static random access memory (SRAM). In particular, the present invention relates to a method and apparatus of handling refresh operations in a semiconductor memory such that the refresh operations do not interfere with external access operations.

DISCUSSION OF RELATED ART

A conventional DRAM memory cell, which consists of one transistor and one capacitor, is significantly smaller than a conventional SRAM cell, which consists of 4 to 6 transistors. However, data stored in a DRAM cell must be periodically refreshed, while the data stored in an SRAM cell has no such requirement. Each refresh operation of a DRAM cell consumes memory bandwidth. For example, the cycle time of a 100 MHz DRAM array is 10 nsec. In this DRAM array, each external access takes 10 nsec, and each refresh access takes at least 10 nsec. Because an external access and a refresh access can be initiated at the same time, the DRAM array must be able to handle both within the allowable access cycle time so as to prevent the refresh access from interfering with the external access. This limits the minimum external access cycle time to be no less than 20 nsec, with 10 nsec for handling the external access and 10 nsec for handling the refresh access. This is true even though the refresh accesses are performed, on average, at a frequency of 62.5 kHz. As a result, the maximum accessing frequency of the DRAM array must be less than or equal to 50 MHz. Thus, a 100 Mhz DRAM memory array is required to create a device capable of operating at 50 MHz. This is simply not economical.

Previous attempts to use DRAM cells in SRAM applications have been of limited success for various reasons. For example, one such DRAM device has required an external signal to control refresh operations. (See, 131,072-Word by 8-Bit CMOS Pseudo Static RAM, Toshiba Integrated Circuit Technical Data (1996).) Moreover, external accesses to this DRAM device are delayed during the memory refresh operations. As a result, the refresh operations are not transparent and the resulting DRAM device cannot be fully compatible with an SRAM device.

In another prior art scheme, a high-speed SRAM cache is used with a relatively slow DRAM array to speed up the average access time of the memory device. (See, U.S. Pat. No. 5,559,750 by Katsumi Dosaka et al, and "Data Sheet of 16 Mbit Enhanced SDRAM Family 4Mx4, 2Mx8, 1Mx16" by Enhanced Memory Systems Inc., 1997.) The actual access time of the device varies depending on the cache hit rate. Circuitry is provided to refresh the DRAM cells. However, the refresh operation is not transparent to external accesses. That is, the refresh operations affect the memory access time. Consequently, the device cannot meet the requirement of total deterministic random access time.

Other prior art schemes use multi-banking to reduce the average access time of a DRAM device. Examples of multi-banking schemes are described in "Data sheet, MD904 To MD920, Multi-bank DRAM (MDRAM) 128Kx32 to 656Kx32" by MoSys Inc., 1996, and in "An Access-Sequence Control Scheme to Enhance Random-Access Performance of Embedded DRAM's" by Kazushige Ayukawa et al, IEEE JSSC, vol. 33, No. 5, May 1998, pp. 800–806. These multi-banking schemes do not allow an individual memory bank to delay a refresh cycle.

Another prior art scheme uses a read buffer and a write buffer to take advantage of the sequential or burst nature of an external access. An example of such a prior art scheme is described in U.S. Pat. No. 5,659,515, entitled "Semiconductor Memory Device Capable of Refresh Operation in Burst Mode" by R. Matsuo and T. Wada. In this scheme, a burst access allows a register to handle the sequential accesses of a transaction while the memory array is being refreshed. However, this scheme does not allow consecutive random accesses. For example, the memory cannot handle a random access per clock cycle.

Another prior art scheme that attempts to completely hide refresh operations in a DRAM cell includes the scheme described in U.S. Pat. No. 5,642,320, entitled "Self-Refreshable Dual Port Dynamic CAM Cell and Dynamic CAM Cell Array Refreshing Circuit", by H. S. Jang. In this scheme, a second port is added to each of the dynamic memory cells so that refresh can be performed at one port while a normal access is carried out at the other port. The added port essentially doubles the access bandwidth of the memory cell, but at the expense of additional silicon area.

Accordingly, it would be desirable to have a memory device that utilizes area-efficient DRAM cells, and handles the refresh of the DRAM cells in a manner that is completely transparent to an accessing memory client external to the memory device. That is, it would be desirable for the refresh operations to be successfully performed without relying on unused external access time. Stated another way, it would be desirable to have a memory device that allows the use of DRAM cells or other refreshable memory cells for building SRAM compatible devices or other compatible memory devices that do not require refresh.

SUMMARY

Accordingly, the present invention provides a memory device that includes a plurality of memory cells that must be periodically refreshed in order to retain data values, and a control circuit for accessing and refreshing the memory cells. In one embodiment, the memory cells are DRAM cells. The control circuit controls the accessing and refreshing of the memory cells such that the refreshing of the memory cells does not interfere with any external access of the memory cells.

The memory cells are arranged in a plurality of independently controlled memory banks. Thus, read, write and refresh operations are independently controlled within each bank. Each of the memory banks is coupled in parallel to a read buffer, such that data read from any one of the memory banks is provided to the read buffer. Each of the memory banks is further coupled in parallel to a write buffer, such that data written to any of the memory banks can be provided from the write buffer.

The control circuit includes an SRAM cache, which has the same configuration as each of the memory banks. A cache read buffer is coupled between an output port of the SRAM cache and the write buffer, thereby facilitating the transfer of data from the SRAM cache to the memory banks. Similarly, a cache write buffer is coupled between an input port of the SRAM cache and the read buffer, thereby facilitating the transfer of data from the memory banks to the SRAM cache. The cache read buffer and the cache write buffer are further coupled to an external data bus. The SRAM cache provides an interface between the external data bus and the memory banks. The SRAM cache implements a write-back policy, such that all write data is initially written to the SRAM cache before being written to the memory banks, and all read data provided to the external data bus is stored in the SRAM cache. In one embodiment, the SRAM cache is configured as a direct map cache. The SRAM cache is selected to have a capacity sufficient to ensure that each of the memory banks is refreshed properly within a predetermined refresh period. That is, even under the worst case cache-thrashing conditions, the required refresh operations will always be performed without delaying any external accesses to the memory device.

In one embodiment, the cache write-back policy is carried out as follows. First, a current access address received on the external data bus is compared with a cached address stored in the SRAM cache to determine whether a cache miss or a cache hit occurs. When a cache hit occurs, the requested data is either read from the SRAM cache (for a read access) or written to the SRAM cache (for a write access). Thus, the memory banks are not accessed when a cache hit occurs. Refresh operations can therefore be performed within the memory banks when a cache hit occurs, when a refresh request is pending. Because the memory banks are independently controlled, all of the memory banks can be simultaneously refreshed during a cache hit. Alternatively, predetermined sets of the memory banks can be simultaneously refreshed.

When a cache miss occurs, a determination is made as to whether the cache entry associated with the cached address contains data that has been modified. That is, a determination is made as to whether the cache entry contains the same data as the associated memory bank. A determination is also made as to whether the current access is a read access or a write access.

If a cache miss occurs and the data in the cache entry has not been modified, then processing proceeds as follows for read and write accesses. For a read access, the desired data is read from the memory bank associated with the current access address. This data is simultaneously provided to the external data bus and written to the SRAM cache, thereby overwriting the original cache entry. Because the original cache entry did not contain modified data, there is no need to write back the original cache entry under these conditions. For a write access, a portion of the original cache entry is overwritten with the new data associated with the write access. The remaining portion of the original cache entry is overwritten with data retrieved from the memory bank identified by the current access address. Again, because the original cache entry did not contain modified data, there is no need to write back the original cache entry under these conditions. Note that only one memory bank needs to be accessed during a cache miss when the cache entry does not contain modified data.

If a cache miss occurs and the data in the cache entry has been modified, processing proceeds as follows. First, the cache entry is written back to the memory bank from which it originated. This write-back operation transfers the cache entry from the SRAM cache, through the cache read buffer and the write buffer, to the memory bank. At the same time, a new cache entry is read from a memory bank identified by the external access address. This new cache entry is written to the SRAM cache. This operation transfers the new cache entry from the memory bank, through the read buffer and the cache write buffer, to the SRAM cache. If the current access is a read access, then the new cache entry is simultaneously routed to the external data bus. If the access is a write access, then the write data is written to the SRAM cache along with the rest of the data of the new cache entry.

Note that only one or two memory banks are accessed during a cache miss. Thus, all of the other memory banks can be refreshed during a cache miss operation. Also note that because read and write accesses to the memory banks are performed simultaneously, each access can be completed during a single clock period. As a result, the memory device is accessed in the same manner as a conventional SRAM.

In accordance with another embodiment, the present invention provides a memory device that includes a plurality of memory cells that must be periodically refreshed in order to retain data values. The memory cells are arranged to form a plurality of memory banks, each arranged in rows and columns. A memory controller is provided to control the accessing and refreshing of the memory cells, such that the refreshing of the memory cells does not interfere with any external read accesses to the memory cells. A read buffer is coupled to the banks and the memory controller. The read buffer has a capacity greater than or equal to the capacity of a memory bank minus one row of memory cells. The read buffer can be constructed from either SRAM cells or DRAM cells.

In one embodiment, the memory controller operates as follows. If an external read access misses the read buffer, the memory controller causes a data value to be read from the memory bank that is addressed by the read access. The memory controller further causes this data value to be written to the read buffer during the same clock cycle. If an external write access hits the read buffer, the memory controller causes the data value associated with the write access to be written to the read buffer. If an external read access hits the read buffer, the memory controller causes the data value requested by the read access to be read from the read buffer.

If the read buffer is constructed using DRAM cells, the read buffer will have to be refreshed. In accordance with one embodiment, the memory controller is configured to enable a refresh access to the read buffer only if there is no pending access to the read buffer.

In accordance with another embodiment, the present invention provides a memory device that includes a plurality of memory cells that must be periodically refreshed in order to retain data values. The memory cells are arranged to form a plurality of memory banks, each arranged in rows and columns. A memory controller is provided to control the accessing and refreshing of the memory cells, such that the refreshing of the memory cells does not interfere with any external write accesses to the memory cells. A write buffer is coupled to the memory banks and the memory controller. The write buffer has a capacity greater than or equal to the capacity of a memory bank minus one row of memory cells. The write buffer can be constructed from either SRAM cells or DRAM cells.

In accordance with one embodiment of the present invention, the memory controller operates as follows. If an external write access hits the write buffer, the memory controller causes external data to be written to the write buffer. If an external write access misses the write buffer, the memory controller causes data to be retired from the write buffer to one of the memory banks through a first port. If an external write access misses the write buffer, the memory controller causes external data to be written to one of the memory banks through a second port. If an external write access hits the write buffer, the memory controller enables a refresh operation in the memory bank addressed by the external write access. If an external write access misses the write buffer, the memory controller delays a refresh operation in the memory bank addressed by the external write access until there is no longer an external access to this memory bank. The memory controller delays a refresh operation in a memory bank when data is being retired from the write buffer to the memory bank.

In this embodiment, the memory controller also stops the retiring of data from the write buffer if an external write access hits the write buffer while data is being retired. The data associated with this external write access is then be written to the write buffer.

If the write buffer and read buffer are implemented together in the same memory device, the memory controller causes data to be read from the write buffer when an external read access hits the write buffer and misses the read buffer. Simultaneously, the memory controller causes the data read from the write buffer to be written to the read buffer.

In another embodiment of the present invention, a central refresh timer periodically asserts a refresh request signal. Daisy-chained connections are provided between access control circuits of the memory banks, such that the daisy-chained connections sequentially pass the refresh request signal to the access control circuits in response to a clock signal. A central refresh address generator generates a refresh address, which is provided to all of the memory banks in parallel. The refresh address generator increments the refresh address each time the refresh signal is asserted.

The present invention will be more fully understood in view of the following description and drawings.

DETAILED DESCRIPTION

In accordance with the present invention, an SRAM compatible device is designed using DRAM cells. This SRAM compatible device is hereinafter referred to as a one-transistor SRAM (1-T SRAM). The 1-T SRAM of the described embodiment has a capacity of 128K words, each word having a length of 32-bits. The 1-T SRAM includes 64 DRAM banks that can operate independent of each other so that parallel operations, such as read, write and refresh, can take place in different DRAM banks simultaneously. A mechanism is provided so that refresh access requests are simultaneously broadcast to multiple DRAM banks. The DRAM banks that receive the broadcast refresh request signal go through a refresh cycle only when there is no bank access pending. A refresh address is supplied locally inside each DRAM bank by its own address refresh counter. In the described embodiment, the refresh request is broadcast to all the DRAM banks. In another embodiment, the refresh request is only broadcast to a subset of the DRAM banks at any one time.

An SRAM cache is incorporated to store the data of the most recently accessed locations. The SRAM cache has a significantly smaller capacity than the DRAM banks. To ensure that all refresh accesses of the DRAM banks are properly performed within a predetermined refresh period, even under the worst case cache thrashing conditions, the size of the SRAM cache is selected to have a storage capacity equal to (or greater than) the storage capacity of one of the DRAM banks, minus the capacity of one row of cells in the DRAM bank. In light of simplicity of design, in the embodiment described below, the SRAM cache has a storage capacity equal to the storage capacity of a DRAM bank.

Figure 1:
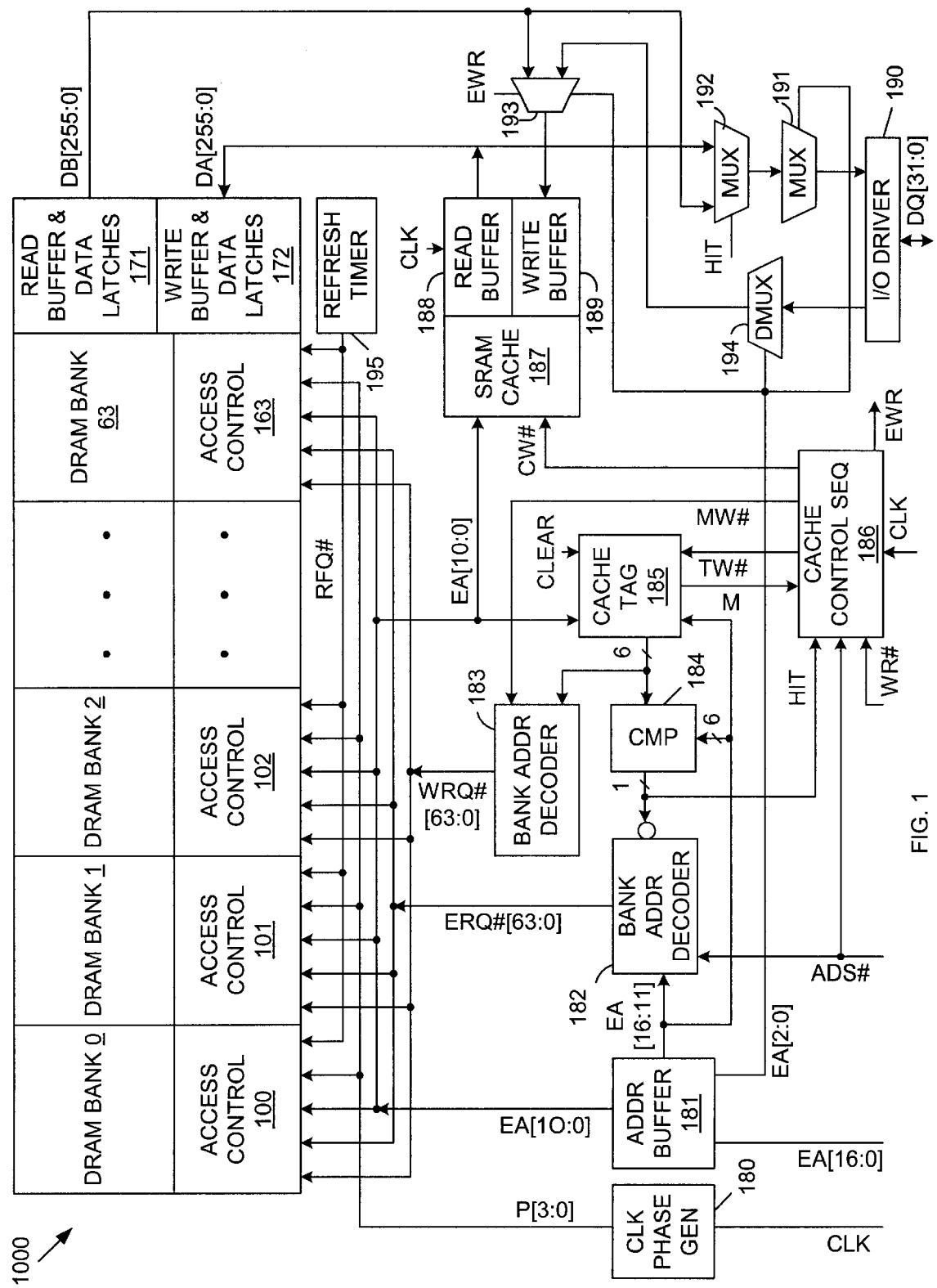
FIG. 1 is a block diagram of a 1-T SRAM in accordance with one embodiment of the present invention.

FIG. 1 is a block diagram of a 1-T SRAM 170 in accordance with one embodiment of the present invention. 1-T SRAM 170 includes sixty-four DRAM banks 0–63, and sixty-four corresponding access control circuits 100–163. As described in more detail below, access control circuits 100–163 are coupled to receive the address and control signals required to access DRAM banks 0–63. Each of DRAM banks 0–63 includes an array of 64 rows and 1024 columns of DRAM cells. The sixty-four DRAM banks 0–63 share a common read buffer/data latch circuit 171 and a common write buffer/data latch circuit 172. As described in more detail below, read and write data is transferred to and from banks 0–63 through circuits 171 and 172. Read buffer 171 and write buffer 172 operate independently, thereby allowing data to be read from one of DRAM banks 0–63 at the same time that data is being written to another one of DRAM banks 0–63.

1-T SRAM 170 also includes clock phase generator 180, address buffer 181, bank address decoders 182–183, comparator 184, cache tag memory 185, cache control sequencer 186, SRAM cache 187, cache read buffer 188, cache write buffer 189, I/O driver 190, multiplexers 191–193, de-multiplexer 194 and refresh timer 195. These elements, which in general control the accesses of 1-T SRAM 170, are described in more detail below.

1-T SRAM 170 operates in response to the following signals: input/output (I/O) data signals DQ[31:0], external address signals EA[16:0], address strobe signal ADS#, write/read indicator WR#, and clock signal CLK (for the synchronization of memory transactions between 1-T SRAM 170 and the outside world). As used herein, the # symbol indicates that a signal is active low. Note that the signals listed above do not include any signals relating to the refresh accesses of DRAM banks 0–63.

An external device initiates an access to 1-T SRAM 170 by asserting a logic low address strobe signal ADS#, driving the write/read indicator signal WR# to the desired state, and providing a memory address EA[16:0]. The ADS# signal is provided to bank address decoder 182 and cache control sequencer 186. The access request is recognized by 1-T SRAM 170 at the rising edge of the CLK signal that occurs after the ADS# signal is asserted low. The WR# signal is provided to cache control sequencer 186. The memory address EA[16:0] is provided to address buffer 181. The 17 address bits EA[16:0] are divided into 4 fields. Address bits EA[16:11] form a bank address field that identifies one of the sixty-four DRAM banks 0–63. Address bits EA[10:5] form a row address field that identifies one of the sixty-four rows in the addressed DRAM bank. Address bits EA[4:3] form a column address field that identifies one of the four 256-bit sections within the addressed row. Finally, address bits EA[2:0] form a byte address field that identifies one of the eight 32-bit words within the addressed 256-bit section.

Read or write data DQ[31:0] is provided to I/O driver 190 during the clock cycle after the access request is recognized. As described above, each of DRAM banks 0–63 includes an array of 64 rows and 1024 columns of DRAM cells. Each of DRAM banks 0–63 is coupled to read buffer 171 and write buffer 172. Read buffer 171 and write buffer 172 include transparent latches that latch read and write data during DRAM read and write operations, respectively. Both read buffer 171 and write buffer 172 include 256 latches, thereby enabling these buffers to store one 256-bit section. Each of DRAM banks 0–63 has an associated independent access control circuit 100–163 to facilitate multi-bank parallel operations. Dedicated read bus DB[255:0] and dedicated write bus DA[255:0] are employed, so that one of DRAM banks 0–63 can perform a write operation while another one of DRAM banks 0–63 can perform a read operation simultaneously.

Figure 2:
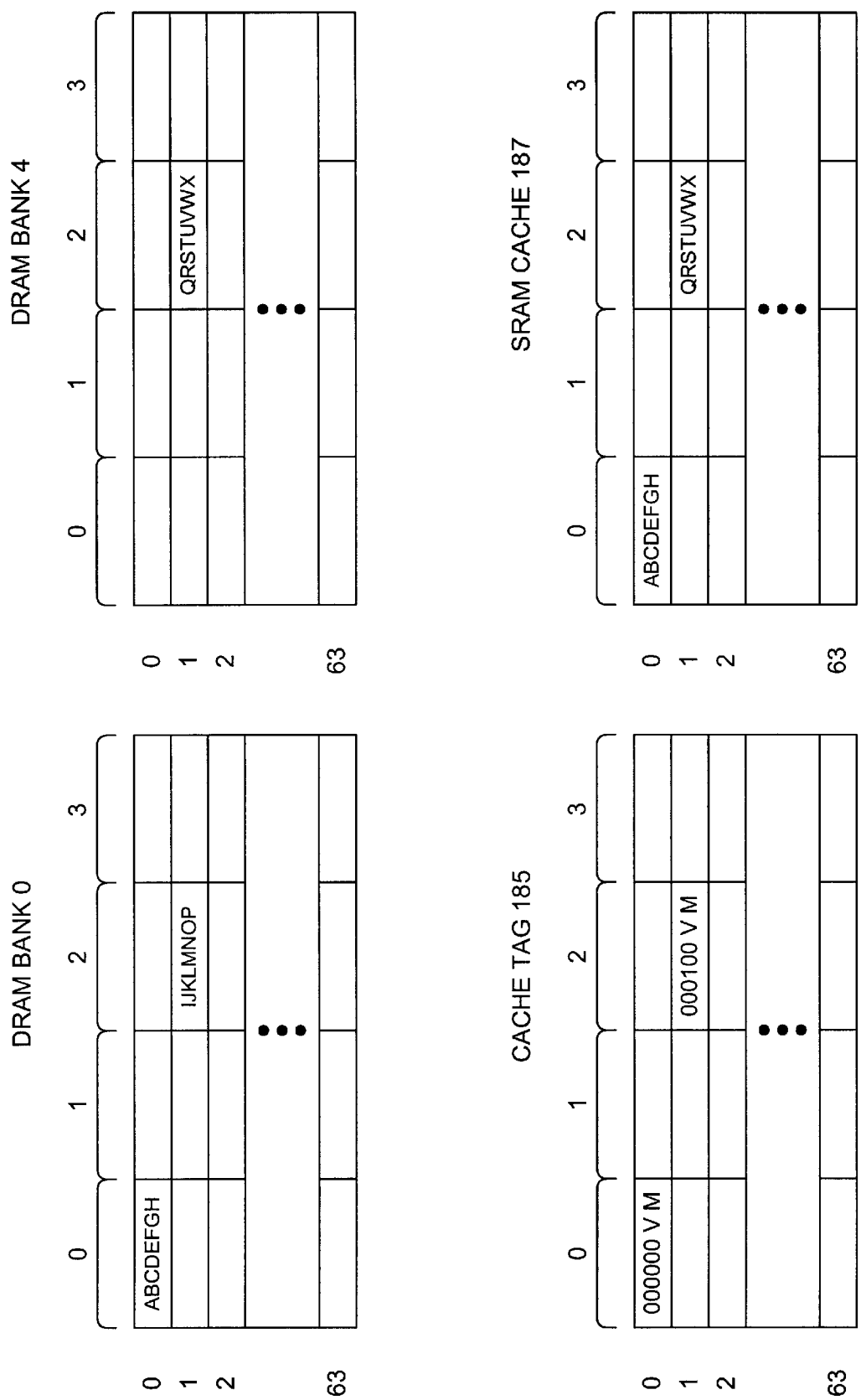
FIG. 2 is a block diagram illustrating the organization of DRAM banks, an SRAM cache memory and a cache tag memory in accordance with one embodiment of the present invention.

FIG. 2 is a block diagram illustrating the organization of DRAM banks 0–63, SRAM cache 187 and cache tag memory 185. Only DRAM banks 0 and 4 are illustrated in FIG. 2 for purposes of clarity. SRAM cache 187 has the same organization as DRAM banks 0–63. That is, SRAM cache 187 includes an array of 64 rows and 1024 columns of SRAM cells. The SRAM cells can be, for example, traditional four-transistor or six-transistor SRAM cells. The columns of DRAM banks 0–63 and the columns of SRAM cache 187 are logically divided into four sections, with each section having 256 columns (i.e., 256 bits). Row 0, section 0 of DRAM bank 0 stores 256 bits in the form of eight 32-bit words A, B, C, D, E, F, G and H. Row 1, section 2 of DRAM bank 0 stores 256 bits in the form of eight 32-bit words I, J, K, L, M, N, O and P. Row 1, section 2 of DRAM bank 4 stores 256-bits in the form of eight 32-bit words Q, R, S, T, U, V, W, and X.

As described in more detail below, SRAM cache 187 stores 256-bit cache entries from the various DRAM banks 0–63. For example, row 0, section 0 of SRAM cache 187 stores a cache entry received from row 0, section 0 of one of DRAM banks 0–63. Similarly, row 1, section 2 of SRAM cache 187 stores a cache entry received from row 1, section 2 of one of DRAM banks 0–63. In the example of FIG. 2, SRAM cache 187 stores the words A, B, C, D, E, F, G and H from DRAM bank 0 as the cache entry for row 0, section 0. Cache tag 185 stores the 6-bit bank address of DRAM bank 0 (i.e., 000000), thereby indicating that the contents of row 0, section 0 of SRAM cache 187 are associated with DRAM bank 0. Each entry of cache tag 185 also includes a valid indicator bit V and a modified indicator bit M, which are described in more detail below. In general, the valid indicator bit V is set to indicate a valid cache entry. The modified indicator bit M, when set, indicates that the associated cache entry has been modified, and that the associated cache entry stored in SRAM cache 187 must be written back to the associated DRAM bank during a cache miss access.

Also in FIG. 2, SRAM cache 187 stores the words Q, R, S, T, U, V, W, and X from DRAM bank 4 as the cache entry for row 1, section 2. Cache tag 185 stores the 6-bit bank address of DRAM bank 4 (i.e., 000100), thereby indicating that the contents of row 1, section 2 of SRAM cache 187 are associated with DRAM bank 4. The above described caching scheme is a direct mapped caching scheme.

Cache read buffer 188 and cache write buffer 189 are coupled to SRAM cache 187. Cache read buffer 188 and cache write buffer 189 enable SRAM cache 187 to perform a read operation and a write operation during the same cycle of the CLK signal. In another embodiment, SRAM cache 187 is fabricated using dual-port SRAM cells, which can be used to support read and write operations during a single cycle of the CLK signal. As described above, SRAM cache 187 is organized as a direct map cache with 256 cache entries, each cache entry containing 256 bits (i.e., eight 32-bit words). Uni-directional internal data bus DA[255:0] couples cache read buffer 188 to write buffer 172. Data bus DA[255:0] carries the data read from cache read buffer 188 to write buffer 172. Uni-directional internal data bus DB[255:0] couples cache write buffer 189 to read buffer 171 (through multiplexer 193). Data bus DB[255:0] carries the read data from read buffer 171 to cache write buffer 189 (through multiplexer 193).

During normal operations, an entire cache entry (256-bits) can be transferred from the read buffer 171 to SRAM cache 187 in one cycle of the CLK signal. Similarly, an entire cache entry can be transferred from SRAM cache 187 to write buffer 172 in one cycle of the CLK signal. Operations of SRAM cache 187 are controlled by cache control sequencer 186 with the help of cache tag memory 185.

The cache scheme is implemented as follows. When 1-T SRAM 170 is powered up, an on-chip power-on reset circuit (not shown) asserts a CLEAR signal, which is applied to cache tag memory 185. In response to the CLEAR signal, all of the valid indicator bits V of cache tag memory 185 are reset to zero, thereby resetting cache tag memory 185. Whenever a cache entry is written to SRAM cache 187, the valid indicator bit V in the associated cache tag entry is set to a logic one value.

A write-back policy is employed in the present invention. This is because a write-through policy, while simpler, would require that data be written to DRAM banks 0–63 for every write transaction that could cause a refresh problem (i.e., if one of banks 0–63 is written continuously for a period of time longer than the maximum allowed refresh period, the bank will not be refreshed properly, which in turn may cause data errors).

The write-back policy will now be described for the four possible read and write transactions of read hit, write hit, read miss and write miss.

When an access is initiated by an external circuit, an address EA[16:0] is provided to address buffer 181. Address buffer 181, in turn, routes this address EA[16:0] to cache tag memory 185. This address EA[16:0] identifies a DRAM bank, row and section being accessed. For example, address EA[16:0] could identify DRAM bank 4, row 1, section 2. In response to address EA[16:0], cache tag memory 185 accesses the bank address stored in the identified row and section. In the described example, cache tag memory 185 would retrieve the bank address stored in row 1, section 2, or 000100. Cache tag memory 185 provides this retrieved bank address to comparator 184. Cache tag memory 185 also provides the modified bit M associated with the retrieved bank address to cache control sequencer 186.

Comparator 184 compares the bank address retrieved from cache tag memory 184 with the current bank address EA[16:11]. If comparator 184 detects a match, then a cache hit exists, and comparator 184 asserts a HIT control signal. If comparator 184 does not detect a match, then a cache miss exists, and comparator 184 does not assert the HIT control signal. The HIT control signal is provided to bank address decoder 182 and cache control sequencer 186.

In response to the ADS#, WR#, M and HIT signals, cache control sequencer 186 determines whether the current access is a read hit, write hit, read miss or write miss access.

If the current access is a read hit access, then SRAM cache 187 contains the desired data. Cache control sequencer 186 therefore causes SRAM cache 187 to provide the desired data to cache read buffer 188. The desired data is routed from cache read buffer 188 to multiplexer 192. Multiplexer 192 routes this data to multiplexer 191 in response to the asserted HIT control signal. Multiplexer 191 routes the one of the eight 32-bit words to I/O driver 190 in response the byte select address bits EA[2:0]. I/O driver 190 drives the selected word on data bus DQ[31:0]. Because DRAM banks 0–63 are not accessed during a read hit access, all of DRAM banks 0–63 are able to perform refresh operations during a read hit access.

If the current access is a write hit access, then SRAM cache 187 stores a cache entry which corresponds with the addressed DRAM bank, row and section. Under these conditions, cache control sequencer 186 causes the external write data to be written to this cache entry, rather than to the addressed DRAM bank. For example, assume that the current write access specifies writing a 32-bit word Z to the last word position of DRAM bank 4, row 1, section 2 (See, FIG. 2). Because the contents of this address (i.e., 32-bit word X) are already stored in SRAM cache 187, a cache write hit exists. The word Z is provided to I/O driver 190 on data bus DQ[31:0]. I/O driver 190 routes the word Z to de-multiplexer 194. In response to the byte address EA[2:0], de-multiplexer routes the word Z on a set of bus lines corresponding to the appropriate word position. The word Z is routed through multiplexer 193, in response to the external write enable signal EWR, to cache write buffer 189. Cache write buffer 189 provides the word Z to overwrite the word X stored in row 1, section 2 of SRAM cache 187. Cache control sequencer 186 also causes the modified indicator bit M associated with row 1, section 2 of cache tag memory 185 to be set. Because DRAM banks 0–63 are not accessed during a write hit access, all of DRAM banks 0–63 can be refreshed during a write hit access.

If the current access is a read miss access, then SRAM cache 187 does not store a cache entry which corresponds with the addressed DRAM bank, row and section. For example, assume that a read operation attempts to access row 1, section 2 of DRAM bank 0 (FIG. 2). A cache miss will be detected because the words Q, R, S, T, U, V, W and X from DRAM bank 4 are stored in the associated entry of SRAM cache 187. Upon detecting the read miss condition, if the modified bit M associated with the cache tag entry is set, cache control sequencer 186 causes the cache entry causing the miss to be written back to its associated DRAM bank. This write-back operation is only required if the modified bit M has been set. If the modified bit M has not been set, then the data stored in SRAM cache 187 is consistent with the data stored in the associated DRAM bank, and no write-back is required. In the present example, the write-back operation consists of the words Q, R, S, T, U, V, W and X being routed from row 1, section 2 of SRAM cache 187 to row 1, section 2 of DRAM bank 4 through cache read buffer 188 and write buffer 172.

At the same time, cache control sequencer 186 initiates a read operation to row 1, section 2 of DRAM bank 0. Data words I, J, K, L, M, N, O and P are read from row 1, section 2 of DRAM bank 0, routed through read buffer 171, multiplexer 193 and cache write buffer 189, and are written to row 1, section 2 of SRAM cache 187. In addition, the cache tag entry associated with row 1, section 2 is updated to reflect the bank address of DRAM bank 0 (i.e., 000000) and the modified bit M of this cache tag entry is reset to zero to indicate that the data stored in SRAM cache 187 is consistent with the data stored in DRAM bank 0. The data words I, J, K, L, M, N, O and P are also routed through multiplexer 192 in response to the de-asserted HIT control signal. Multiplexer 191 routes a selected one of data words I, J, K, L, M, N, O and P to I/O driver 190 (and thereby to data bus DQ[31:0]) in response to byte select address EA[2:0]. For example, multiplexer 191 may route data word M to I/O driver 190. Note that during a read miss access, all of the DRAM banks other than the DRAM banks involved in the read or write-back operations can be refreshed.

If the current access is a write miss access, then SRAM cache 187 does not store a cache entry which corresponds with the addressed DRAM bank, row and section. For example, assume that a write operation attempts to write a word Z to row 1, section 2 of DRAM bank 0 (FIG. 2). A cache miss will be detected because the words Q, R, S, T, U, V, W and X from DRAM bank 4 are stored in the associated cache entry of SRAM cache 187. Upon detecting the write miss condition, if the modified bit associated with the cache tag entry is set, cache control sequencer 186 causes the cache entry causing the miss to be written back to its associated DRAM bank. This write-back operation is only required if the modified bit M has been set. If the modified bit M has not been set, then the data stored in SRAM cache 187 is consistent with the data stored in the associated DRAM bank, and no write-back is required.

In the present example, the words Q, R, S, T, U, V, W and X are routed from row 1, section 2 of SRAM cache 187 to row 1, section 2 of DRAM bank 4 through cache read buffer 188 and write buffer 172. At the same time, cache control sequencer 186 initiates a read operation to row 1, section 2 of DRAM bank 0. Data words I, J, K, L, M, N, O and P are read from row 1, section 2 of DRAM bank 0, and are routed through read buffer 171 to multiplexer 193. The 32-bit data word Z to be written in accordance with the current write access is also provided to multiplexer 193 (through data bus DQ[31:0], I/O driver 190, and de-multiplexer 194).

Multiplexer 193 routes seven of the eight data words I, J, K, L, M, N, O and P, plus the data word Z to cache write buffer 189 in response to the byte address EA[2:0]. For example, if byte address EA[2:0] identifies first data word position, then multiplexer 193 routes words Z, J, K, L, M, N, O and P to cache write buffer 189. These data words are then written from cache write buffer 189 to row 1, section 2 of SRAM cache 187. In addition, cache tag memory 185 is updated by writing the bank address associated with DRAM bank 0 to row 1, section 2 of cache tag memory 185. The modified indicator bit M of this cache tag entry is also set at this time, thereby indicating that the cache entry in SRAM cache 187 is not the same as the corresponding data in DRAM bank 0 (i.e., SRAM cache 187 contains Z, J, K, L, M, N, O and P, while DRAM bank 0 contains I, J, K, L, M, N, O and P). Note that during a write miss access, all of the DRAM banks other than the DRAM banks involved in the read and write-back operations can be refreshed.

DRAM Operations

Figure 3:
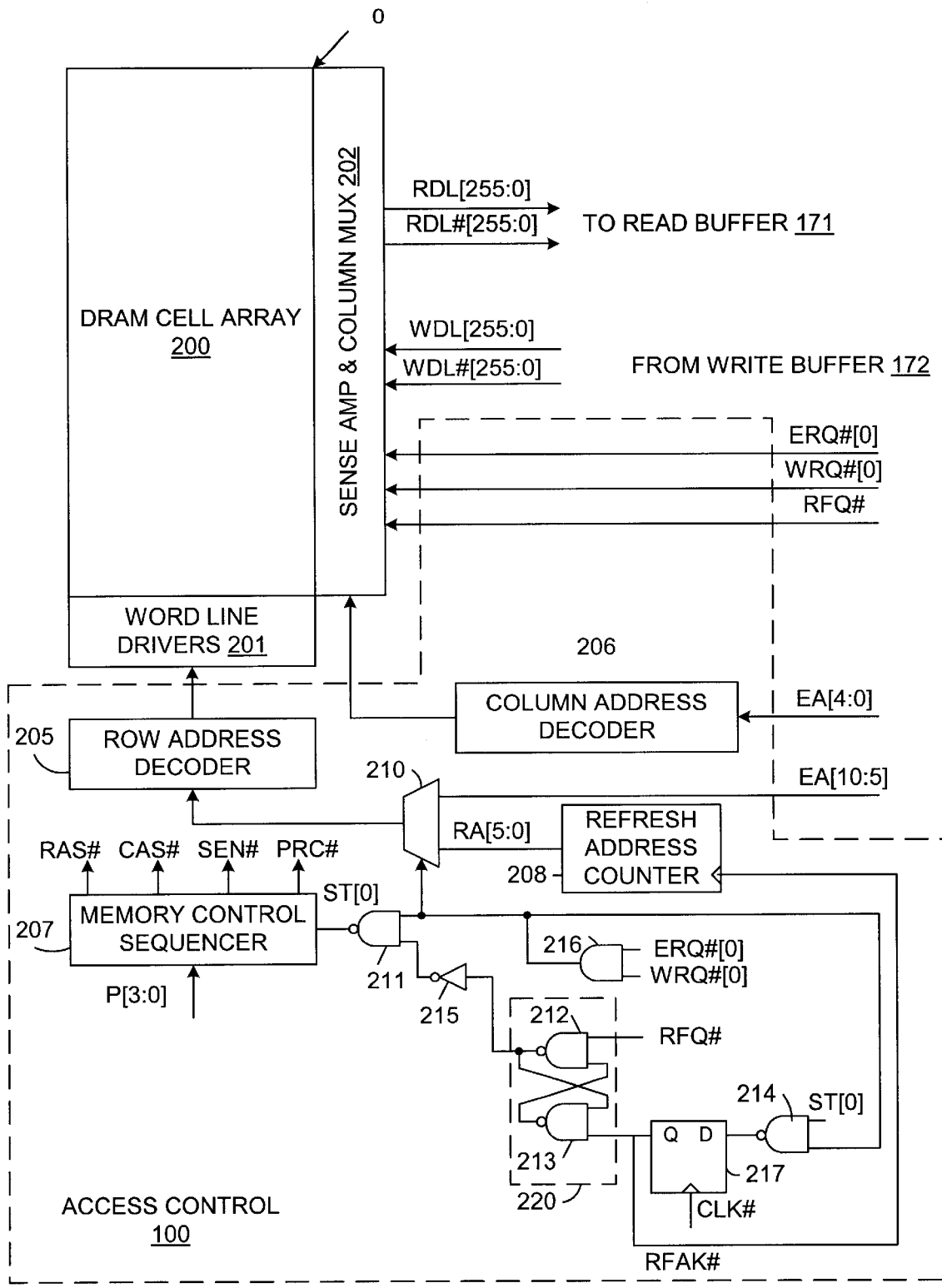
FIG. 3 is a schematic diagram of a DRAM bank and an associated access control circuit in accordance with one embodiment of the present invention.

FIG. 3 is a schematic diagram of DRAM bank 0 and access control circuit 100. Because each of DRAM banks 1–63 is identical to DRAM bank 0, and each of access control circuits 101–163 is identical to access control circuit 100, only DRAM bank 0 and access control circuit 100 are described in detail. DRAM bank 0 consists of a DRAM cell array 200 having 64 rows and 1024 columns. DRAM bank 0 further includes all the conventional circuits associated with a DRAM array, such as word line drivers 201 and sense amplifiers & column multiplexers 202. Data buses RDL[255:0] and RDL#[255:0] couple DRAM bank 0 to read buffer 171. Data buses WDL[255:0] and WDL#[255:0] couple DRAM bank 0 to write buffer 172. Access control circuit 100 includes row address decoder 205, column address decoder 206, memory control sequencer 207, refresh address counter 208, address multiplexer 210, and access arbitration logic for regulating the external accesses and the refresh accesses. The access arbitration logic includes NAND gates 211–214, inverter 215, AND gate 216 and flip-flop 217.

Memory control sequencer 207 generates the access control signals RAS# (row access), CAS# (column access), SEN# (sense amplifier enable), and PRC# (pre-charge) for controlling the operations of DRAM bank 0. These control signals are described in more detail in commonly owned U.S. Pat. No. 6,078,547, "Method and Structure for Controlling Operation of a DRAM array", by Wingyu Leung, which is hereby incorporated by reference in its entirety. In general, the RAS#, CAS#, SEN# and PRC# signals are generated at predetermined times within a single cycle of the CLK signal, wherein the predetermined times are determined with respect to the rising and falling edges of the CLK signal. As a result, DRAM bank 0 completes a memory cycle in one cycle of the CLK signal. The timing of the RAS#, CAS#, SEN# and PRC# control signals are controlled by the four phase clock signals P[3:0] generated by clock phase generator 180 (FIG. 1). Clock phase generator 180 generates phase clock signals P[3:0] in response to the CLK signal using a delay line scheme. Clock phase generator 180 is described in more detail in U.S. Pat. No. 6,078,547. Since a memory cycle takes only one clock period, DRAM bank 0 can process one random access or one row refresh during one clock cycle.

A memory cycle is initiated when NAND gate 211 asserts a logic high ST[0] signal to memory control sequencer 207. The ST[0] signal is driven high when any of the three following signals is asserted low: read request signal ERQ#[0], write request signal WRQ#[0], or refresh request signal RFQ#. The designator [0] corresponds with the DRAM bank address. Thus, DRAM bank 23 would have similar signals ST[23], ERQ#[23] and WRQ#[23]. Note that each of DRAM banks 0–63 is thereby independently controlled.

Read request signal ERQ#[0] is generated by bank address decoder 182 (FIG. 1). Read request signal ERQ#[0] is asserted low when a cache miss occurs and data must be read from DRAM bank 0 as a result of the cache miss. The conditions under which such a read access may be required have been described above in connection with the write miss and read miss accesses.

Write request signal WRQ#[0] is generated by bank address decoder 183 (FIG. 1). Write request signal WRQ#[0] is asserted low when a cache miss occurs and data stored in SRAM cache 187 must be written back to DRAM bank 0. The conditions under which a write-back operation is required have been described above in connection with the write miss and read miss accesses.

Read request signal ERQ#[0] and write request signal WRQ#[0] are mutually exclusive. That is, these signals cannot be activated at the same time. This is because during a cache miss access, the bank address associated with the cache entry being replaced is necessarily different than the bank address associated with the data being retrieved from a DRAM bank. However, either write request signal WRQ#[0] or read request signal ERQ#[0] can be asserted low at the time that the refresh request signal RFQ# is asserted low to initiate a refresh access. As described below, both the write request signal WRQ#[0] and the read request signal ERQ#[0] always have priority over the refresh request signal RFQ#. As a result, accesses to DRAM bank 0 (and accesses to DRAM banks 1–63) are never delayed by refresh accesses.

Refresh Operation

Refresh timer 195 (FIG. 1) is a 15-bit binary counter. At 100 MHz operation, refresh timer 195 generates a refresh request every 320 μs. Each of memory banks 0–63 is refreshed independently, with one row of a memory bank being refreshed during one refresh cycle. A refresh access is implemented by reading a row of a DRAM bank. Reading a row of a DRAM bank has the effect of refreshing the charge in the DRAM cells in the row. Sixty four refresh cycles are required to completely refresh all 64 rows of a DRAM bank. The refresh time for 1-T SRAM 170 is thus 320 μs times 64 or 20.48 ms.

The output of refresh timer 195 provides the refresh request RFQ# signal, which is activated for one clock cycle when refresh timer 195 reaches a full count, that is, when all the counter bits are high. Because the period of refresh timer 195 is 320 μs and it takes only 64×4×10 ns (64 rows, 4 cache line per row) or 2.56 μs to completely access all of the cache entries of SRAM cache 187, at least one cache hit or memory idle cycle will occur in each of DRAM banks 0–63 during each refresh timer period. This guarantees that none of DRAM banks 0–63 will miss a refresh cycle, and that each of DRAM banks 0–63 will be refreshed in a timely manner.

However an access collision can occur when a refresh request and an external access request (i.e., a cache miss access) are generated during the same clock cycle. The access collision is handled in the DRAM bank by processing the cache miss access first and delaying the refresh request by saving the low state of the refresh request signal RFQ# in a flip-flop. The refresh accumulation flip-flop 220 is formed by the NAND gates 212 and 213 in FIG. 3. The cache miss access always takes priority over the refresh access to ensure that the external memory access is always completed without delay. As a result, the DRAM bank refresh accesses are transparent to the outside world, thereby making 1-T SRAM 170 behave in a manner that is completely compatible with an SRAM device.

The access priority is set by address multiplexer 210, which is controlled to provide either the row address EA[10:5] or the refresh row address RA[5:0] to row address decoder 205. Row address EA[10:5] is the row address associated with a cache miss access. Address multiplexer 210 is controlled by the output signal provided by AND gate 216. The input terminals of AND gate 216 are connected to receive the read request signal ERQ#[0] and the write request signal WRQ#[0]. When either of these request signals is asserted low, address multiplexer 210 selects row address EQ[10:5] for the current memory cycle. In the absence of cache miss access, both ERQ#[0] and WRQ#[0] are de-asserted high, thereby causing multiplexer 210 to route refresh address RA[5:0] to row address decoder 205.

The refresh access is delayed until the DRAM bank is idle. Flip-flop 220 is set when the refresh request signal RFQ# is asserted low. Flip-flop 220 remains in the set state until the refresh acknowledge signal RFAK# is asserted low. The refresh acknowledge signal RFAK# is asserted low when the signals ST[0], ERQ#[0] and WRQ#[0] are high. When all these signals are high, a refresh access is initiated. Flip-flop 217 synchronizes the resetting of flip-flop 220 with the CLK signal. Six-bit refresh address counter 208 keeps track of the row address to be refreshed. Refresh address counter 208 is incremented for every low to high transition of the RFAK# signal. After refresh address counter 208 reaches the full count 111111, it resets to 000000.

Operations Timing

Figure 4:
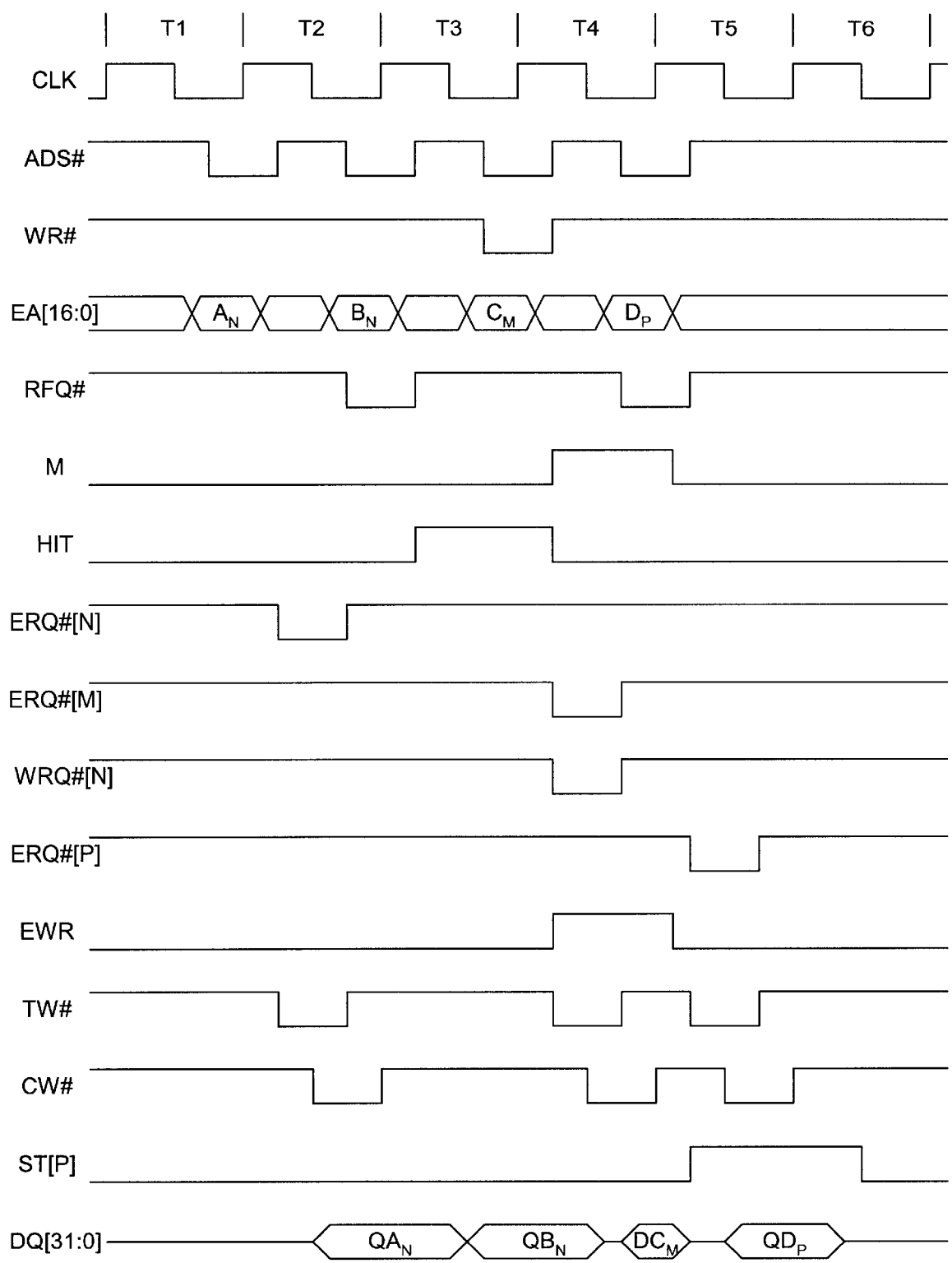
FIG. 4 is a waveform diagram illustrating the timing of four consecutive transactions in accordance with one embodiment of the present invention.

FIG. 4 is a waveform diagram illustrating the timing of four consecutive transactions $A_N$, $B_N$, $C_M$ and $D_P$. Transactions $A_N$ and $B_N$ are accesses to same DRAM bank N. Transaction $C_M$ is an access to DRAM bank M, and transaction $D_P$ is an access to DRAM bank P. More specifically, transaction $A_N$ is a read miss access to DRAM bank N, transaction $B_N$ is a cache hit access to DRAM bank N that collides with a refresh access at the beginning of clock cycle T3, transaction $C_M$ is a write miss transaction to DRAM bank M that requires write-back of modified data to DRAM bank R, and transaction $D_P$ is a read miss access to DRAM bank P.

During clock cycle T1, a memory transaction $A_N$ is initiated with the ADS# signal being driven low, a memory address EA[16:0] being provided to address buffer 181, and the WR# signal being driven high, thereby indicating the transaction is a read access. The memory address EA[16:11] identifies the requested bank address as DRAM bank N. At the rising edge of clock cycle T2, read transaction AN is detected. The row and column addresses represented by address signals EA[10:3] are buffered by address buffer 181 and are supplied to all of memory banks 0–63, as well as cache tag memory 185. In cache tag memory 185, the cached bank address pointed to by the row and column address is gated out to comparator 184, where it is compared with the bank address EA[16:11] of transaction $A_N$. Comparator 184 drives the HIT signal low, thereby indicating the current transaction AN is a cache miss. In response to the logic low HIT signal and the current bank address EA[16:11], bank address decoder 182 asserts the read request signal ERQ# [N] low. Note that all of the other read request signals ERQ# are de-asserted high. The modified indicator bit M associated with the cached bank address is provided from cache tag 185 to cache control sequencer 186. In the described example, this modified indicator bit M is low, thereby indicating that the cache entry to be replaced has not been modified. In response, cache control sequencer 186 drives the memory write signal MW# to bank address decoder 183 high. In response, bank address decoder 183 de-asserts all of the write request signals WRQ#[63:0] high, thereby inhibiting a write-back operation.

The low state of read request signal ERQ#[N] causes DRAM bank N to start a memory read cycle. At the same time, cache control sequencer 186 asserts the tag write signal TW# low, thereby causing bank address N to be written to cache tag memory 185 in the location pointed to by address EA[10:3]. In the second half of clock cycle T2, the data read from DRAM bank N is available on bus DB[255:0] and driven to the external data bus DQ[31:0] through the 2:1 multiplexer 192, the 8:1 multiplexer 191 and the I/O driver 190. The data on DB[255:0] is also driven to SRAM cache 187 through multiplexer 193. Since the transaction is a read operation, the external write enable signal EWR# is low, thereby routing all 256 bits of data DB[255:0] to cache write buffer 189 of SRAM cache 187. When the cache write enable signal CW# is asserted low, the data DB[255:0] is written to SRAM cache 187.

At the beginning of clock cycle T3, the read transaction $B_N$ is detected. A refresh request is also detected and latched in every DRAM bank 0–63. Comparator 184 detects a match between the current bank address signal EA[16:11] and the cached bank address provided by cache tag memory 185. In response, comparator 184 asserts a logic high HIT signal. The logic high HIT signal causes all read request signals ERQ#[63:0] and all write request signals WRQ#[63:0] to remain high. In the absence of a cache miss request, all DRAM banks 0–63 start a refresh cycle with the refresh address RA[5:0] being supplied by the corresponding refresh address counter 208 (FIG. 3). Since transaction $B_N$ is a read access, the cache write enable signal CW# stays high and the requested data is transmitted from SRAM cache 187 to cache read buffer 188. Cache read buffer 188 drives the data to 2:1 multiplexer 192 on data bus DA[255:0]. The logic high HIT signal causes multiplexer 192 to route the data from cache read buffer 188 to 8-to-1 multiplexer 191. The buffered word select address EA[2:0] selects one of the eight 32-bit words for output. The selected data is then driven to the external bus DQ[31:0] by I/O driver 190.

At the beginning of clock cycle T4, write transaction $C_M$ is detected. The DRAM bank address M associated with transaction $C_M$ is provided to cache tag memory 185 and comparator 184. In response, cache tag memory 185 provides the cached bank address R. Comparator 184 determines that the current bank address M does not match the cached bank address R, and in response, drives the HIT signal low to indicate a write miss transaction. In the current example, the modified indicator bit M of the accessed cache tag entry is set, thereby indicating that the associated cache entry in SRAM cache 187 contains modified data that must be written back to DRAM bank R. As a result, both read request signal ERQ#[M] and write request signal WRQ#[R] are asserted low by bank address decoders 182 and 183, respectively, thereby initiating a read operation in DRAM bank M and a write operation in DRAM bank R. The read data from DRAM bank M is output through the transparent latches of read buffer 171 onto the bus DB[255:0]. The read data is latched into read buffer 171 on the falling edge of the CLK signal during cycle T4.

At the same time, cache control sequencer 186 de-asserts the cache write signal CW# high during the first half of cycle T4, thereby causing SRAM cache 187 to perform a read operation. The cache entry to be written back to DRAM bank R is output through transparent latches in cache read buffer 188 onto bus DA[255:0]. The data is latched in cache read buffer 188 at the falling edge of the CLK signal during cycle T4. The cache read data on DA[255:0] is written to DRAM bank R through the DRAM write buffer 172. Similarly, the DRAM read data on DB[255:0] is written to SRAM cache 187 through cache write buffer 189 when the cache write signal CW# is activated low during the second half of clock cycle T4. As a result, the cache entry associated with the current address EA[10:3] is replaced. The bank address M is written to cache tag memory 185, with both the V and M bits set. The modified indicator bit M is set to reflect the fact that the cache line content is modified by the current write transaction $C_M$. Write data is driven from data bus DQ[31:0] through de-multiplexer 194 to multiplexer 193 where the data DB[255:0] retrieved from DRAM bank M is merged with the external write data. The merging is controlled by the word select address on EA[2:0] and the external write signal EWR which is asserted high by cache control sequencer 186. The merged data is written to SRAM cache 187 through cache write buffer 189.

At the beginning of clock cycle T5, both read transaction $D_P$ and a refresh request are detected. During normal operation, the refresh request signal RFQ# is asserted only once in approximately every 32000 clock cycles. The timing shown in FIG. 4 is therefore for illustrative purposes only. In this example, the bank address EA[16:11] associated with read transaction $D_P$ does not match the associated cached bank address stored in cache tag memory 185, thereby causing comparator 184 to provide a logic low HIT signal (i.e., a read miss access). In response to the logic low HIT signal, bank address decoder 182 asserts the read request signal ERQ#[P] low. In the present example, the modified indicator bit M associated with the cached bank address is low, thereby indicating that a write-back operation is not required. As a result, cache control sequencer 186 de-asserts the MW# signal, thereby causing bank address decoder 183 to provide logic high values for each of write request signals WRQ#[63:0]. All of DRAM banks other than DRAM bank P goes through a refresh cycle at this time, as their corresponding ERQ# and WRQ# signals are de-asserted high. In DRAM bank P, the low state of the refresh request signal RFQ# sets the refresh flip-flop 220 formed by NAND gates 212 and 213 (FIG. 3). However, the low state of read request signal ERQ#[P] selects the row address EA[10:5] for the memory cycle. Assertion of read request signal ERQ#[P] causes the signal ST[P] to be asserted high and a memory read cycle to carried out, with the consecutive assertion of the RAS#, CAS#, SEN# and PRC# signals during the clock cycle T5. Read data is output from the DRAM bank P through read buffer 171 to data bus DB[255:0] where it is routed to SRAM cache 187, as well as to multiplexers 192 and 191 and I/O driver 190, and eventually to data bus DQ[31:0]. Since transaction $D_P$ is a read transaction, the external write signal EWR is de-activated low and the entire cache line is written to SRAM cache 187 on the assertion of the cache write signal CW#.

During cycle T6, no external access request is pending. However, the refresh flip-flop 220 in DRAM bank P remains set, thereby causing the signal ST[P] to remain high for the first half of clock cycle T6. As a result, another memory cycle is carried out within DRAM bank P during clock cycle T6. With both the read request signal ERQ#[P] and the write request signal WRQ#[P] de-asserted high, the refresh address RA[5:0] from refresh address counter 208 is passed through multiplexer 210 to row address decoder 205. As a result, the row identified by refresh address RA[5:0] is refreshed. On the falling edge of the CLK signal during cycle T6, the low output of NAND gate 214 is latched into flip-flop 217, thereby driving refresh acknowledge signal RFAK# low and resetting refresh flip-flop 220. The activation of the RFAK# signal also increments refresh address counter 208. However, output of refresh address counter 208 is not incremented until the RFAK# signal is deactivated high. As a result, the refresh address RA[5:0] provided by refresh address counter 208 is held constant during the memory cycle. The refresh acknowledge signal RFAK# is de-activated high on the falling edge of the CLK signal during cycle T7.

In the forgoing manner, 1-T SRAM 170 can be accessed at a rate of one memory cycle per clock cycle, without any delays for refresh operations.

Additional Embodiment

Figure 5:
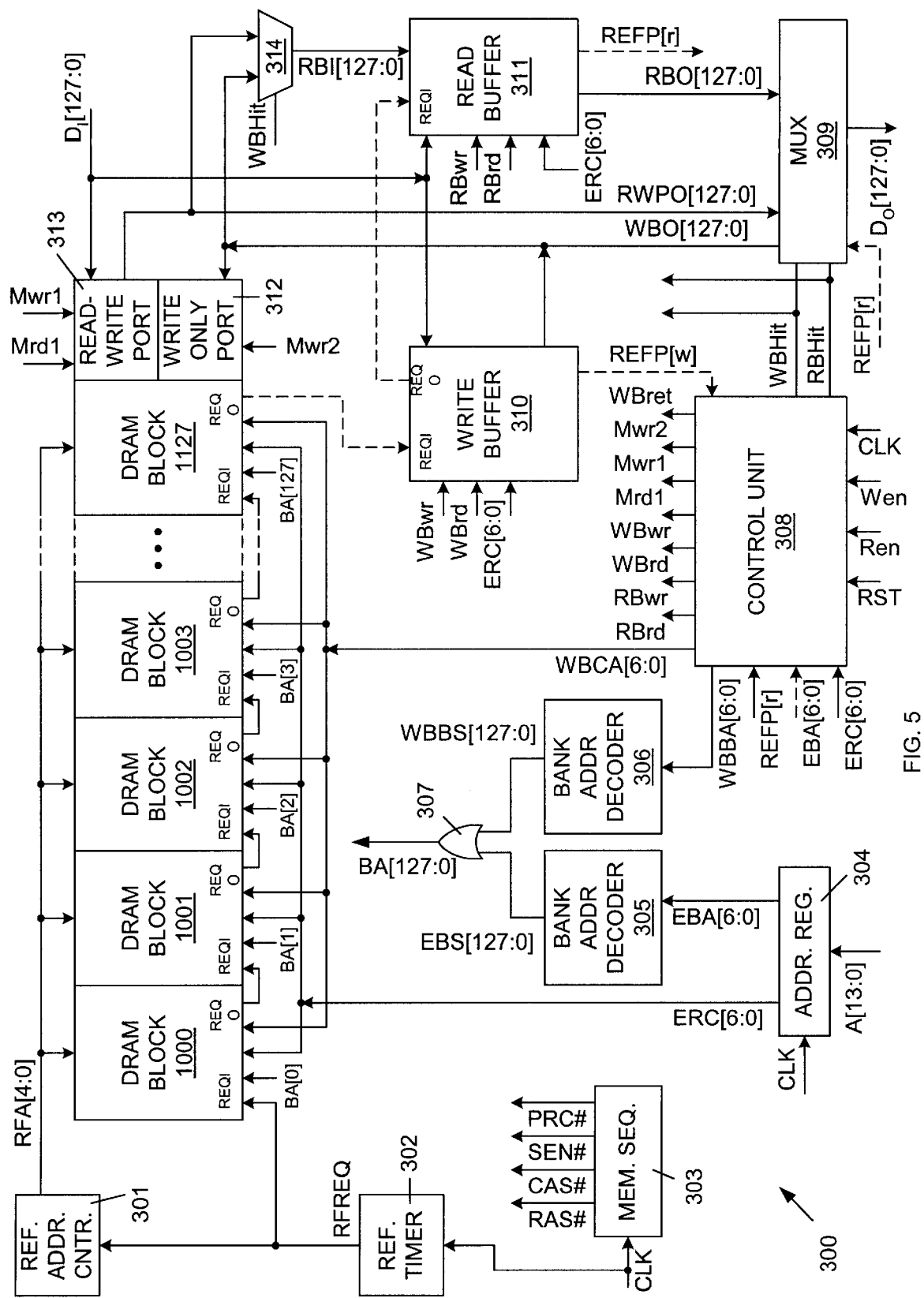
FIG. 5 is a block diagram of a 1-T SRAM system in accordance with another embodiment of the present invention.

FIG. 5 is a block diagram of a 1-T SRAM system 300 in accordance with another embodiment of the present invention. 1-T SRAM system 300 includes 128 DRAM memory blocks 1000–1127, refresh address counter 301, refresh timer 302, memory sequencer 303, address register 304, bank address decoders 305–306, logical OR gate 307, memory control unit 308, multiplexer 309, write buffer 310, read buffer 311, write-only port 312, read-write port 313, and multiplexer 314.

DRAM memory blocks 1000–1127 are capable of storing 16K 128-bit words. Each of memory blocks 1000–1127 has a corresponding DRAM bank (for a total of 128 banks) arranged in an array having 32 rows by 512 columns. The external interface of system 300 includes a 128-bit input data bus for receiving input data bits Di[127:0], a 128-bit output data bus for receiving output data bits Do[127:0], a read enable line for receiving a read enable (Ren) signal, a write enable line for receiving a write enable (Wen) signal, a clock input terminal for receiving a clock (Clk) signal, and a 14-bit address bus for receiving address bits A[13:0]. Each of the DRAM banks in blocks 1000–1127 contains a corresponding row address decoder and a corresponding column address decoder.

All external signals are referenced to the rising edge of the Clk signal. The address signal A[13:0] is divided into 3 fields: a 7-bit bank address A[13:7] (which identifies one of the 128 memory blocks 1000–1127), a 5-bit row address A[6:2] (which identifies one of the 32 rows in a memory bank) and a 2-bit word address A[1:0] (which identifies one of the four 128-bit words in a row). DRAM memory blocks 1000–1127 are connected in parallel to a plurality of drivers in read-write port 313, which serves as a bi-directional port to memory blocks 1000–1127. DRAM memory blocks 1000–1127 are also connected in parallel to a plurality of drivers in write-only port 312, which serves as a unidirectional (write-only) port to memory blocks 1000–1127. Read-write port 313 and write-only port 312 serve as the interface between DRAM memory blocks 1000–1127, write buffer 310, read buffer 311, and the rest of the I/O logic. The bus connections between the various elements of 1-T SRAM system 300 are illustrated in FIG. 5.

To ensure that all refresh accesses of memory blocks 1000–1127 are properly performed within a predetermined refresh period, even under the worst case cache thrashing conditions, the size of the write buffer 310 and read buffer 311 are each selected to have a storage capacity equal to (or greater than) the storage capacity of one of the DRAM memory blocks 1000–1127, minus the capacity of one row of cells in the DRAM memory block. In light of simplicity of design, in the embodiment described below, both write buffer 310 and read buffer 311 include a memory bank with the same organization as the memory banks in DRAM memory blocks 1000–1127. Thus, in the described embodiment, both write buffer 310 and read buffer 311 include a memory bank having an array of 32 rows by 512 columns of memory cells. These memory cells can be constructed using either SRAM cells or DRAM cells. To simplify the following description, write and read buffers 310–311 implemented using SRAM cells are first described. Then, the additional control required to implement read and write buffers 310–311 using DRAM cells is discussed. Note that in the described example, write buffer 310 and read buffer 311 each have a minimum size of 31 rows and 512 columns of memory cells.

In the address path, the external accessing address signal A[13:0] is latched in address register 304. In response, address register 304 provides a 7-bit external bank address signal EBA[6:0] to bank address decoder 305 and memory control unit 308. External bank address signal EBA[6:0] (which consists of address signals A[13:7]) identifies the bank address of the current access operation. In response to the external bank address signal EBA[6:0]$_1$, bank address decoder 305 generates a 128-bit external bank-select signal EBS[127:0], which identifies the bank address of the current access operation. The external bank-select signal EBS[127:0] includes one logic high signal corresponding to the addressed bank, and 127 logic low signals corresponding to the non-addressed banks. External bank-select signal EBS[127:0] is provided to OR gate 307.

Bank address decoder 306 is coupled to receive a write buffer bank address WBBA[6:0] from memory control unit 308. As described in more detail below, the WBBA[6:0] identifies the bank address associated with a write cache tag stored in write buffer 310. In response to the WBBA[6:0] signal, bank address decoder 306 generates a 128-bit write buffer bank-select signal WBBS[127:0], which identifies the bank address corresponding with the write cache tag. The write buffer bank-select signal WBBS[127:0] includes one logic high signal corresponding to the cached bank, and 127 logic low signals corresponding to the non-cached banks. Write buffer bank-select signal WBBS[127:0] is provided to OR gate 307.

OR gate 307 provides the logical OR of the external bank-select signal EBS[127:0] and the write buffer bank-select signal WBBS[127:0] to create the bank access signal BA[127:0]. Each of the 128 bank access signals BA[127:0] is connected to a corresponding one of memory blocks 1000–1127.

Address register 304 also provides an external row-column address signal ERC[6:0], which identifies the row and column addresses of the current access operation. The external column address signal ERC[6:0] is selected to correspond with external address bits A[6:0]. The external row-column address signal ERC[6:0] is provided in parallel to each of memory blocks 1000–1127, write buffer 310, read buffer 311, and memory control unit 308.

In general, memory system 300 operates as follows. Memory control unit 308 controls the accessing and refreshing of the memory cells such that the refreshing of the memory cells does not interfere with any external access of the memory cells.

Each of the DRAM banks in memory blocks 1000–1127 is independently controlled. Thus, read, write and refresh operations are independently controlled within each bank. Each of the memory banks is coupled in parallel to both write buffer 310 and read buffer 311. Both write buffer 310 and read buffer 311 have the same structure as the memory banks in memory blocks 1000–1127.

Memory system 300 is refreshed using a multi-bank refresh scheme. In the preferred embodiment, central refresh timer 302 is used to generate periodic refresh requests to DRAM memory blocks 1000–1127. Refresh timer 302 generates the refresh request by driving its output signal RFREQ high for one clock cycle every 1 msec. Thus, in a 100 MHz system, the refresh request signal RFREQ is asserted high once every 100,000 clock cycles. The RFREQ signal is driven to the input terminal REQI of memory block 1000 as input refresh request signal REQI[0]. Inside memory block 1000, the REQI[0] signal is provided to the input terminal of a D-register. (See, D-register 2121 of FIG. 11.) The REQI[0] signal is latched into the D-register on the rising edge of the Clk signal. The output terminal of the D-register is connected to provide an output refresh request signal REQO[0] at output terminal REQO. The REQO[0] signal is therefore driven high one clock cycle after the REQI[0] signal is activated high. Each output terminal REQO is connected to an input terminal REQI of a neighboring memory block. The refresh request to the memory blocks is thus generated by a daisy chain formed by the D-registers connecting to the REQI and REQO terminals of the memory blocks 1000–1127.

In the embodiment in which write buffer 310 and read buffer 311 are constructed from SRAM cells, the refresh request signal RFREQ is propagated from memory block 1000 to 1127 (and is not provided to write buffer 310 and read buffer 311). However, if write buffer 310 and read buffer 311 are constructed from DRAM cells, the refresh request signal RFREQ is propagated from memory block 1127 to write buffer 310 and read buffer 311. These connections are illustrated by dashed lines in FIG. 5.

Moreover, if write buffer 310 and read buffer 311 are constructed using DRAM cells, then write buffer 310 and read buffer 311 will generate refresh pending signals REFP[w] and REFP[r], respectively, to indicate whether a refresh is pending within these buffers 310–311. These signals are illustrated with dashed lines in FIG. 5.

A 5-bit refresh address RFA[4:0] is generated by refresh address counter 301. The refresh address RFA[4:0] is incremented each time the RFREQ signal is asserted high. The 5-bit refresh address RFA[4:0] is broadcast to all of DRAM memory blocks 1000–1127. The refresh address is also broadcast to write buffer 310 and read buffer 311 when these buffers 310–311 are constructed from DRAM cells. The refresh address RFA[4:0] designates the row location in memory blocks 1000–1127 to be refreshed before the next activation of the RFREQ signal. The proper fresh period in this embodiment is defined as the time elapsed between two activations of the RFREQ signal (i.e., the period of refresh timer 302). The proper refresh period is set equal to or less than the refresh time of a memory cell divided by the number of rows in a memory bank.

In another embodiment, the refresh request signal RFREQ is broadcast to all of memory blocks 1000–1127. When the RFREQ signal is activated, each memory bank receiving the activated RFREQ signal executes a refresh cycle if there is no access conflict. Otherwise, the refresh operation is delayed until there is no access conflict.

A memory bank fails to be refreshed properly if the bank cannot execute the refresh operation during the proper refresh period. In the present example, the proper refresh period is equal to the time between two activations of the RFREQ signal, or 1 msec. This happens when the memory bank is accessed continuously for a period longer than the proper refresh period. A refresh operation of a memory bank can be completed within one cycle of the Clk signal. If a memory bank has at least one clock cycle during the proper refresh period during which the memory bank is not accessed, then the memory bank can fulfill the refresh obligation by using this idle cycle to perform a refresh operation. An idle cycle in a memory bank is created when there is no external access, or when an external access hits another bank. Therefore, if the external access switches banks at least once within a proper refresh period, then all the memory banks can be refreshed properly. As described in more detail below, write buffer 310 and read buffer 311 ensure that at least one idle memory cycle is provided during the proper refresh period for a bank that is accessed continuously during the proper refresh period.

In the present embodiment, memory system 300 provides for 128-bit input data values and 128-bit output data values. Read buffer 311 includes a memory bank having 32 rows and 512 columns of memory cells. Read buffer 311 can therefore store 128 128-bit words or 128 entries. For every read access that misses read buffer 311, a 128-bit data word is fetched from the addressed memory bank (or write buffer 310) and is driven to the data output bus as data output signal Do[127:0]. At the same time, the retrieved data is also written to read buffer 311. If the read access hits read buffer 311, then the requested data is read from read buffer 311 and the memory banks in memory blocks 1000–1127 are not accessed. If a write access hits read buffer 311, then the write data is written to both read buffer 311 and either the addressed memory bank or write buffer 310, as described in more detail below.

A single read buffer cache tag having two fields is used to keep track of the data stored in read buffer 311. One of the two fields is a 7-bit bank address field that identifies the bank that provided the data currently stored in read buffer 311. The other field is a 128-bit valid field that stores a 1-bit valid bit for each of the 128 entries of read buffer 311. A set (i.e., logic "1") valid bit in the valid field indicates that the data stored in the corresponding entry is valid. A reset (i.e., logic "0") valid bit indicates that the data stored in the corresponding entry is invalid. Thus, read buffer 311 acts like a shadow of the memory bank being accessed. If a read or write access occurs to a bank having an address different from the one contained in the bank address field of the read buffer cache tag, then the bank address field of the read buffer cache tag is updated to reflect this different bank address. In addition, all the valid bits in the valid field are reset, except for the valid bit associated with the new entry. The valid bit associated with the new entry is set and the read data is written to the corresponding entry of read buffer 311.

In the worst case, a single memory bank is continuously subjected to read accesses. If one of these read accesses hits read buffer 311 during a proper refresh period, an idle cycle is created in the memory bank that read buffer 311 is shadowing. This memory bank can be refreshed during this idle cycle. If the continuous read accesses miss read buffer 311, then data will be accumulated in read buffer 311. In the worst case, the read accesses traverse the entire address space of the single memory bank, such that the read buffer completely shadows the entire contents of the single memory bank (i.e., read buffer 311 stores an identical copy of the data in the single memory bank). Under this circumstance, read buffer 311 is filled in 128 clock cycles. At this time, another read access to the same memory bank necessarily results in a read buffer hit. Because the proper refresh period of 1 msec is longer than the read buffer fill period of 128 clock cycles, the read buffer hit creates an idle cycle for the single memory bank. During this idle cycle, the single memory bank is refreshed.

To ensure coherence of the data stored in read buffer 311, data for a write access is written to read buffer 311 if the write access hits read buffer 311. This data is also written to the addressed memory bank or write buffer 310, as described in more detail below. A write access hits read buffer 311 if the bank address of the write access matches the bank address field of the read buffer cache tag, and the valid bit of read buffer 311 is set for the entry corresponding with the address of the write access.

To summarize the operation of read buffer 311, data is written to read buffer 311 when a read miss or a write hit occurs. Data is read from read buffer 311 when a read hit occurs. In the foregoing description, read buffer 311 is constructed with SRAM cells, such that refresh handling within read buffer 311 is not necessary. When read buffer 311 is constructed using DRAM cells, refresh handling within read buffer 311 becomes necessary. This refresh handling is described in more detail below.

Write buffer 310 is configured in the same manner as read buffer 311. Thus, write buffer 310 includes a memory bank having 32 rows and 512 columns of memory cells. Write buffer 310 can therefore store 128 128-bit words or 128 entries. Write buffer 310 also includes a single write buffer cache tag having two fields, which is used to keep track of the data stored in write buffer 310. One of the two fields is a 7-bit bank address field that identifies the bank to which the data currently stored in write buffer 310 is to be written. The other field is a 128-bit valid field that stores a 1-bit valid bit for each of the 128 entries of write buffer 310. A set (i.e., logic "1") valid bit in the valid field indicates that the data stored in the corresponding entry is valid. A reset (i.e., logic "0") valid bit indicates that the data stored in the corresponding entry is invalid.

During a write access, the data associated with the write access is written to write buffer 310, as long as write buffer 310 is not busy with other tasks, such as retiring a previously stored entry (or refreshing its contents when write buffer 310 is constructed using DRAM). When the write access data is being written to write buffer 310, the memory bank addressed by the write access is allowed to perform a refresh operation. If a single memory bank is continuously written, write buffer 310 will eventually be completely filled with valid data intended for the single memory bank. When this occurs, all of the valid bits of the write buffer cache tag are set.

If a write access addresses a memory bank having an address different from the address stored in the bank address field of the write buffer cache tag, then data retiring starts.

During data retiring, data in write buffer 310 is retired to the memory bank identified by the bank address field of the write buffer cache tag. The data in write buffer 310 is retired through write-only port 312. During this time, write buffer 310 is busy with data retiring and therefore cannot be used to handle any write access. The current write access is therefore handled by the memory bank designated by the current write access address. The data for the current write access is provided to the addressed memory bank through read-write port 313. If the refresh request signal is activated during this time, the refresh operations are delayed in both the memory bank handling the external access and the memory bank handling the data retiring. The refresh operations in the other memory banks are processed without delay. The refresh operation in the memory bank handling the external access can be performed during any clock cycle when there is no longer an external access to this bank. In the worst case, if a single memory bank is accessed continuously, the refresh operation in this single memory bank is delayed until write buffer 310 has completed the data retiring process. When the data retiring process has been completed, write buffer 310 handles the subsequent write accesses to the single memory bank. The refresh operation in the memory bank targeted for the data retiring is delayed for any clock period when data retiring is carried out. During the retiring process, only valid entries are retired. The valid bit of each retired entry is reset after the data in that entry is retired. In the worst case, the retiring process takes 128 clock cycles. Because the proper refresh period is longer than the duration of the worst case data retiring process (128 clock cycles), the pending refresh in both memory banks can be carried out after the data retiring process is completed, without exceeding the proper refresh period.

During the data retiring process, if an external access hits the memory bank targeted for data retiring, the retiring process is stopped and the write access is handled by write buffer 310. An external read access hitting write buffer 310 and missing read buffer 311 causes data to be read from write buffer 310 to the data output bus of memory device 300 and simultaneously causes data to be written to read buffer 311, with the read buffer cache tag being updated. Data coherence between write buffer 310, read buffer 311 and memory blocks 1000–1127 is ensured by updating read buffer 311 for any write access that hits read buffer 311.

The structure and operation of the various elements of memory system 300 will now be described in more detail.
Memory Control Unit 308

Figure 6:
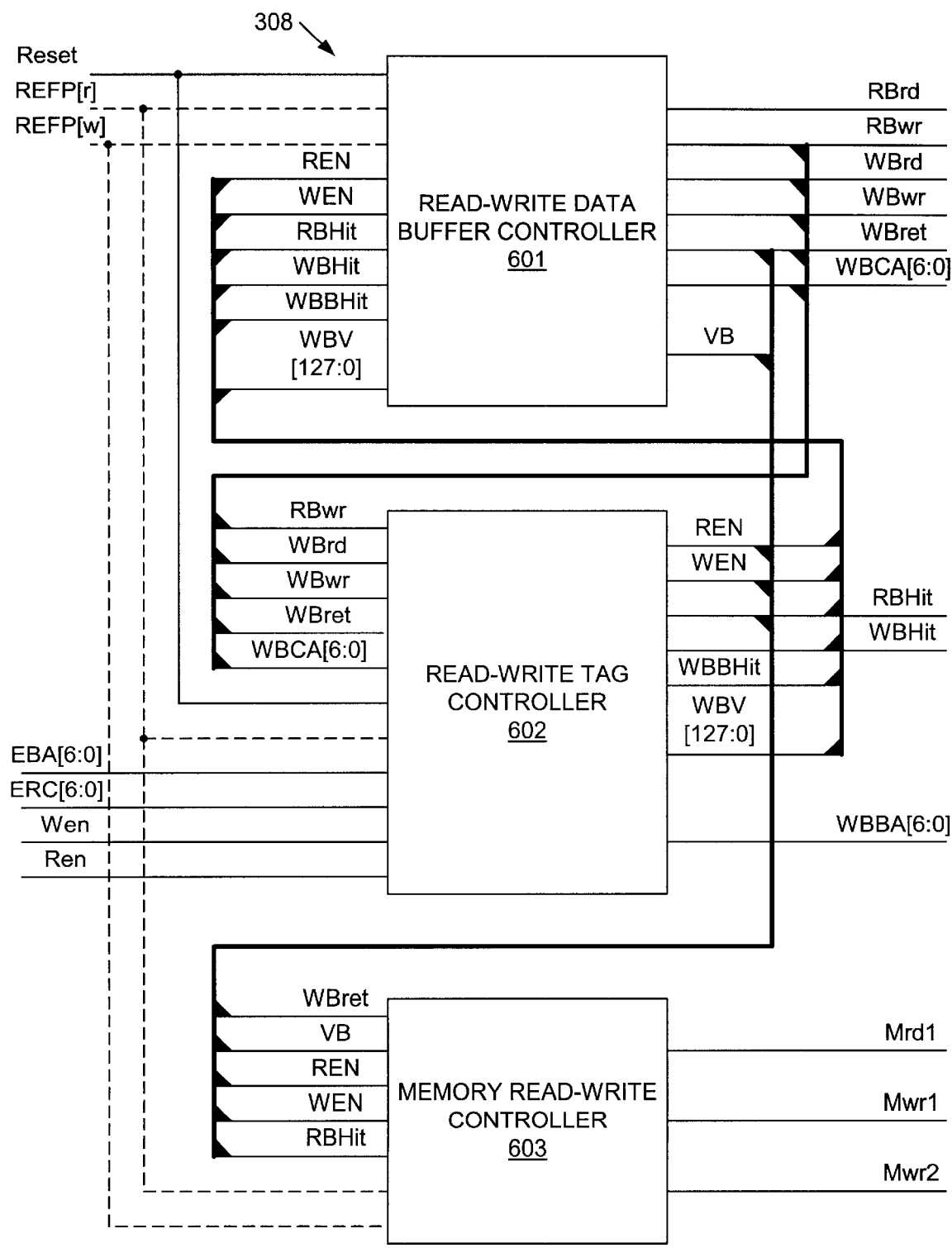
FIG. 6 is a block diagram of a memory control unit for the 1-T SRAM system of FIG. 5 in accordance with one embodiment of the present invention.

FIG. 6 is a block diagram of memory control unit 308 in accordance with one embodiment of the present invention. Memory control unit 308 includes read-write data buffer controller 601, read-write cache tag controller 602 and memory read-write controller 603. In general, read-write data buffer controller 601 is responsible for activating read and write accesses to write buffer 310 and read buffer 311. Read-write cache tag controller 602 is responsible for controlling the cache tag entries associated with write buffer 310 and read buffer 311. Memory read-write controller 603 is responsible for activating read and write accesses to memory blocks 1000–1127. Memory read-write controller 603 also directs the transfer of data between memory ports 312–313 and memory blocks 1000–1127.

Memory control unit 308 operates in response to the following external signals: the global reset signal RST, the external write enable signal Wen, the external read enable signal Ren, the external bank address signal EBA[6:0], and the external row-column address signal ERC[6:0]. When write buffer 310 and read buffer 311 are constructed using DRAM cells, memory control unit 308 also receives read buffer refresh pending signal REFP[r] and write buffer refresh pending signal REFP[w] (as indicated by dashed lines in FIG. 6).

FIG. 6 further illustrates the various control signals generated by read-write data buffer controller 601, read-write cache tag controller 602 and memory read-write controller 603. These control signals are described in more detail below.
Read/Write Cache Tag Controller 602

Figure 7:
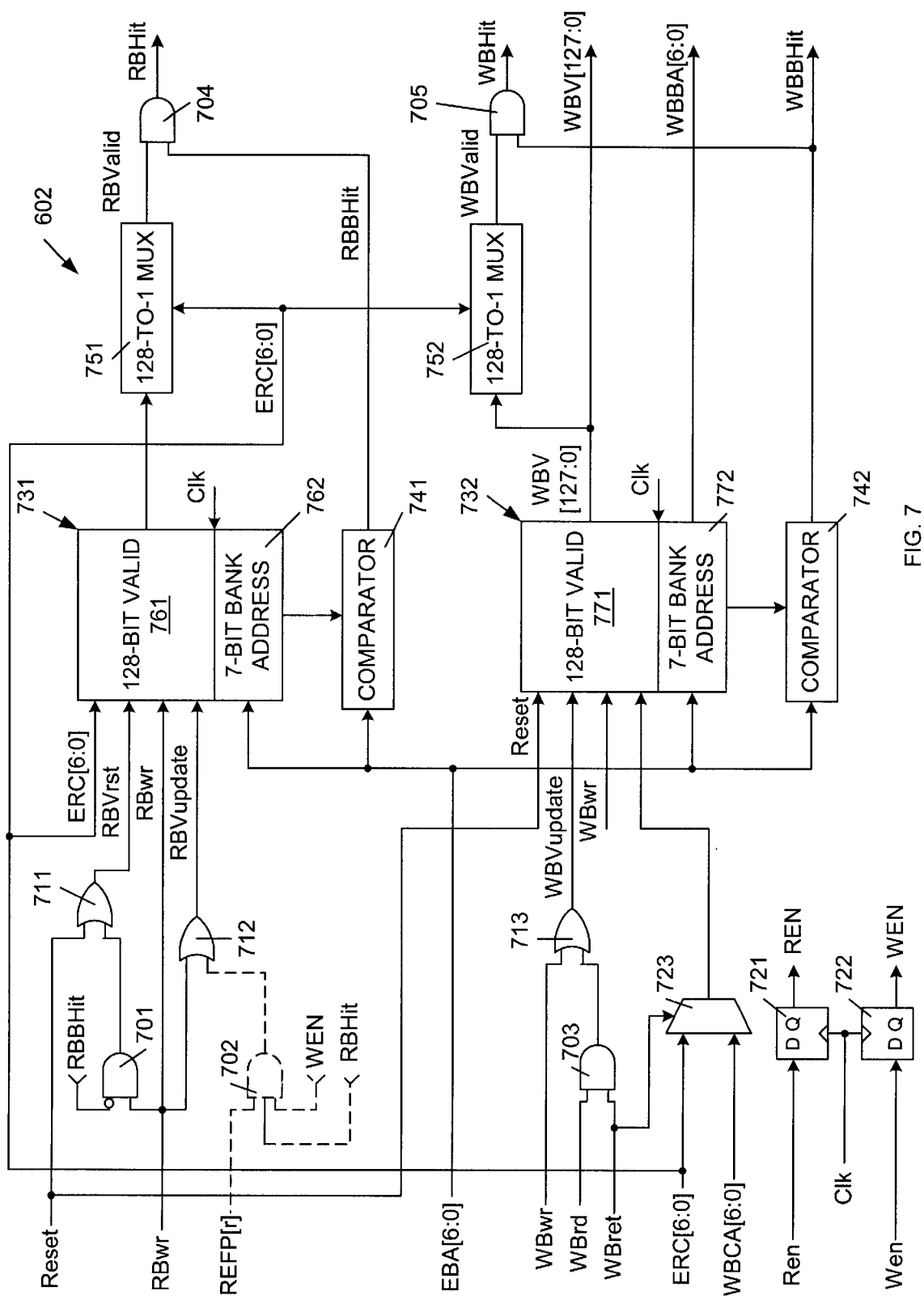
FIG. 7 is a circuit diagram of a read-write tag controller in accordance with one embodiment of the present invention.

FIG. 7 is a circuit diagram of read-write tag controller 602 in accordance with one embodiment of the present invention. Read-write cache tag controller 602 includes AND gates 701–705, OR gates 711–713, D-registers 721–722, multiplexer 723, read buffer cache tag memory 731, write buffer cache tag memory 732, comparators 741–742, and 128-to-1 multiplexers 751–752. Read buffer cache tag memory 731 includes a 128-bit read valid memory 761 and a 7-bit read bank address memory 762. Similarly, write buffer cache tag memory 732 includes a 128-bit write valid memory 771 and a 7-bit write bank address memory 772.

Read valid memory 761 stores 128 read valid bits corresponding to the 128 entries of read buffer 311. Read bank address memory 762 stores the bank address associated with the valid entry or entries of read buffer 311. Similarly, write valid memory 771 stores 128 write valid bits corresponding to the 128 entries of write buffer 310. Write bank address memory 772 stores the bank address associated with the valid entry or entries of write buffer 310.

The external read and write enable signals Ren and Wen are latched by D-registers 721 and 722 at the rising edge of the Clk signal. In response, the D-registers 721 and 722 provide internal read enable signal REN and internal write enable signal WEN, respectively.

In general, read-write cache tag controller 602 generates a write buffer hit signal (WBHit) and a read buffer hit signal (RBHit) for controlling the operations of the write and read buffers 310–311, as well as the memory banks 1000–1127. The RBHit signal is generated as follows. Comparator 741 compares the external bank address EBA[6:0] with the read cache bank address stored in read bank address memory 762. If a match exists, comparator 741 provides a logic high RBBHit signal to AND gate 704.

The contents of read valid memory 761 are provided to 128-to-1 multiplexer 751 as a 128-bit signal RBV[127:0]. The external row-column address ERC[6:0] is provided to control multiplexer 751. In response, multiplexer 751 passes the read valid bit associated with the entry designated by the external address. The selected valid bit is routed through multiplexer 751 as a read buffer valid signal (RBValid). An RBValid signal having a logic high value indicates that a corresponding word stored in read buffer 311 is valid. The RBBHit and RBValid signals are logically "ANDed" by AND gate 704, thereby generating the read buffer hit signal RBHit. A logic high RBHit signal indicates the occurrence of a read buffer hit. Conversely, a logic low RBHit signal indicates a read buffer miss.

The external row-column address ERC[6:0] is also provided to a decoder (not shown) in read buffer cache tag memory 731. In response, the decoder selects a corresponding one of the 128 bits in read valid memory 761 for setting or resetting during a read buffer update. The read buffer update is enabled by a logic high read buffer update signal (RBVupdate). The RBVupdate signal is asserted high when a read buffer write enable signal (RBwr) is asserted high. This logical function is implemented by OR gate 712. The generation of the read buffer write enable signal RBwr is described in more detail below in connection with read-write data buffer control 601.

If read buffer 311 is constructed using DRAM cells, then the RBVupdate signal is also asserted high when the WEN signal, the RBHit signal and the read buffer refresh pending signal REFP[r] are all asserted high. This logical function is carried out by optional AND gate 702 and OR gate 712. AND gate 702 is illustrated in dashed lines to indicate that this gate is only used when read buffer 311 is constructed using DRAM cells.

All the valid bits in read valid memory 761 are reset to logic low values in response to a logic high read buffer reset signal (RBVrst). The RBVrst signal is asserted high when the external reset signal (Rst) is asserted high, or when a read access misses read buffer 311 (i.e., the RBBHit signal is low and the RBwr signal is high). These functions are implemented by AND gate 701 and OR gate 711. Read bank address memory 762 is updated with the external bank address EBA[6:0] when the RBwr signal is asserted high.

The WBHit signal is generated in a manner similar to the RBHit signal. Thus, comparator 742 compares the external bank address EBA[6:0] with the write cache bank address stored in write bank address memory 772. If a match exists, comparator 742 provides a logic high WBBHit signal to AND gate 705.

The contents of write valid memory 771 are provided to 128-to-1 multiplexer 752 as a 128-bit signal WBV[127:0]. The external row-column address ERC[6:0] is provided to control multiplexer 752. In response, multiplexer 752 passes the write valid bit associated with the entry designated by the external address. The selected valid bit is routed through multiplexer 752 as a write buffer valid signal (WBValid). A WBValid signal having a logic high value indicates that a corresponding word stored in write buffer 310 is valid. The WBBHit and WBValid signals are logically "ANDed" by AND gate 705, thereby generating the write buffer hit signal WBHit. A logic high WBHit signal indicates the occurrence of a write buffer hit. Conversely, a logic low WBHit signal indicates a write buffer miss.

Note that the contents of write bank address memory 772 are provided as write buffer bank address WBBA[6:0] and the contents of write valid memory 771 are provided as write valid bits WBV[127:0].

Multiplexer 723 is coupled to receive the external row-column address signal ERC[6:0] and a write buffer retiring entry address WBCA[6:0]. The write buffer retiring entry address WBCA[6:0] is described in more detail below in connection with read-write data buffer controller 601. Multiplexer 723 is controlled by the write buffer retire enable signal WBret. If the WBret signal has a logic high value (indicating that the contents of write buffer 310 are being retired), then multiplexer 723 selects the write buffer retiring entry address WBCA[6:0]. If the WBret signal has a logic low value, then multiplexer 723 selects the external row-column address ERC[6:0]. The output terminal of multiplexer 723 is connected to a decoder (not shown) in write buffer cache tag memory 732. In response, this decoder selects a corresponding one of the WBV[127:0] bits stored in write valid memory 771 for setting or resetting during a write buffer update.

A write buffer update is enabled by a logic high write buffer update signal (WBVupdate). The WBVupdate signal is asserted high when a write buffer write enable signal (WBwr) is asserted high. The generation of the WBwr signal is described in more detail below in connection with read-write data buffer controller 601. The WBVupdate signal is also asserted high when a write buffer read enable signal (WBrd) is asserted high and the write buffer retire enable signal WBret is asserted high (i.e., when data in write buffer 310 is being retired). The generation of the WRrd and WBret signals are described in more detail below in connection with read-write data buffer controller 601. These logical functions are carried out by AND gate 703 and OR gate 713.

All the write valid bits stored in write valid memory 771 are reset to logic low values when the external reset signal (Rst) is asserted high. The write bank address memory 772 is updated with the external bank address EBA[6:0] when the WBwr signal is asserted high.

Read buffer cache tag memory 731 and write buffer cache tag memory 732 are constructed using D-registers. The outputs of these registers are valid after the rising-edge of the Clk signal. This ensures that the updated values do not affect the operations occurring in the same clock cycle.

Read-Write Data Buffer Controller 601

Figure 8:
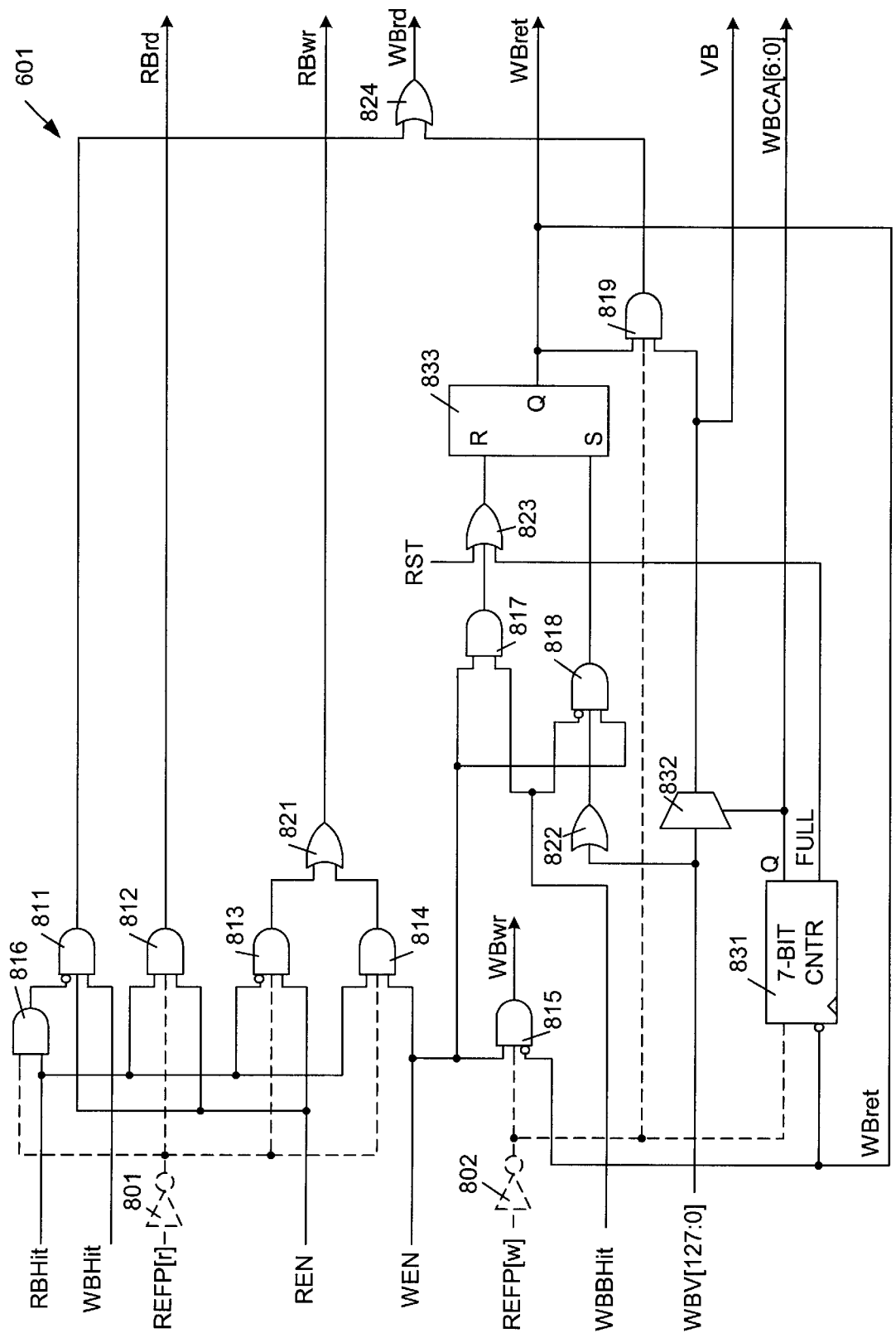
FIG. 8 is a circuit diagram of a read-write data buffer controller in accordance with one embodiment of the present invention.

FIG. 8 is a circuit diagram of read-write data buffer controller 601 in accordance with one embodiment of the present invention. Read-write data buffer controller 601 includes inverters 801–802, AND gates 811–819, OR gates 821–824, 7-bit counter 831, multiplexer 832 and R-S register 833. In general, read-write data buffer controller 601 activates read and write accesses to write and read buffers 310–311. Read-write data buffer controller 601 receives the WBBHit, WBHit, RBHit, WBV[127:0], WEN and REN signals generated by read-write cache tag controller 602, as well as the external reset signal RST. If write buffer 310 and read buffer 311 are constructed using DRAM cells, then read-write data buffer controller 601 is also coupled to receive the write buffer refresh signal REFP[w] and the read buffer refresh signal REFP[r] (as indicated by dashed lines in FIG. 8). Using these input signals and the algorithm discussed above, read-write data buffer controller 601 generates the read buffer read enable signal RBrd, the read buffer write enable signal RBwr, the write buffer read enable signal WBrd, and the write buffer write enable signal WBwr.

The read buffer read enable signal RBrd is asserted high when a read access hits read buffer 311 (and there is no pending refresh to read buffer 311). That is, the RBrd signal is asserted high when both the RBhit and REN signals are high (and the REFP[r] signal, if present, is low). This function is implemented by AND gate 812.

The read buffer write enable signal RBwr is asserted high when a write access hits read buffer 311 or when a read access misses read buffer 311. That is, the RBwr signal is asserted high when the RBHit signal is low and the REN signal is high, or when the RBHit signal is high and the WEN signal is high. This function is implemented by AND gates 813–814 and OR gate 821. Note that if the REFP[r] signal is present, this signal must have a logic low value (i.e., no pending refresh to read buffer 311) for the RBwr signal to be asserted.

The write buffer retire signal WBret is asserted high when data is to be retired from write buffer 310 to memory blocks 1000–1127. Thus, the WBret signal is asserted high when a write access occurs to a bank different from the bank that write buffer 310 is shadowing. This condition is signaled when the WBBHit signal is low, the WEN signal is high, and one of the valid bits WBV[127:0] stored in write valid memory 771 is high. This logic is implemented by OR gate 822, AND gate 818 and R-S register 833.

Data is retired from write buffer 310 over a period of 128 cycles of the Clk signal. During this time, the WBret signal stays at a logic high state. 7-bit counter 831 is used to generate the write buffer retiring entry address WBCA[6:0]. Write buffer retiring entry address WBCA[6:0] is also provided to control 128-to-1 multiplexer 832. In response to the write buffer retiring entry address WBCA[6:0], multiplexer 832 routes a write valid bit from the WBV[127:0] signal that corresponds with the entry identified by the WBCA[6:0] signal. A logic high write valid bit is routed through multiplexer 832 as a logic high valid bit signal (VB). The VB signal and the WBret signal are provided to input terminals of AND gate 819 (along with the inverted REFP[w] signal, if present). The output of AND gate 819 is provided to OR gate 824 to generate the write buffer read signal WBrd. If both the VB and WBret signals have logic high values (and the REFP[w] signal, if present, has a logic low signal, indicating that there is no pending refresh in write buffer 310), then the write buffer read enable signal WBrd is asserted high. When the write buffer read enable signal WBrd is high, data from the entry designated by the write buffer retiring entry address WBCA[6:0] is read out from write buffer 310 and written to the memory bank shadowed by write buffer 310 (i.e., the memory bank identified by the write buffer bank address WBBA[6:0] stored in write bank address memory 772).

If the valid bit passed by multiplexer 832 is not set, indicating that the associated entry in write buffer 310 is not valid, the VB signal will have a logic low value. Under these conditions, the WBrd signal is driven low and data is not retired from write buffer 310 during this cycle.

The 7-bit counter 831 increments every clock cycle, until all of the bits of the write buffer retiring entry address WBCA[6:0] become logic "1" values. At this time, counter 831 drives the output signal FULL to a logic high state. The logic high FULL signal resets R-S register 833 (through OR gate 823). As a result, the WBret signal is driven low, thereby terminating the data retiring process.

R-S register 833 is also reset when the WBBHit and WEN signals are both high, indicating a write buffer hit during a write access. In addition, R-S register 833 is reset when the external reset signal RST is asserted high. These functions are performed by AND gate 817 and OR gate 823.

The WBret signal is also connected to the synchronous reset input terminal of 7-bit counter 831. The low state of the WBret signal causes counter 831 to be reset on the following rising-edge of the Clk signal. When counter 831 is reset, all its outputs are driven low. If write buffer 310 is implemented using DRAM cells, then 7-bit counter 831 stops incrementing when a refresh is pending in write buffer 310 (i.e., the REFP[W] signal is asserted high)), thereby allowing write buffer 310 to be refreshed.

The WBrd signal is also asserted high when a read access hits write buffer 310, but misses read buffer 311. This condition is indicated by a logic high WBHit signal, a logic low RBHit signal, and a logic high REN signal. This logic function is implemented by AND gate 811 and OR gate 824.

When write buffer 310 and read buffer 311 are implemented using DRAM cells, the WBrd signal is asserted high when the REFP[r] signal is high, the REN signal is high and the WBHit signal is high. That is, data is read from write buffer 310 when a read access hits write buffer 310 and a refresh is pending read buffer 311. This logic function is implemented by AND gates 811 and 816. To enable the data to be read out from write buffer 310 through multiplexer 309 (FIG. 5), the REFP[r] signal is provided to control output multiplexer 309. If the WBHit and REFP[r] signals are both high, then output multiplexer 309 is configured to couple the WBO[127:0] bus to data output bus Do[127:0].

Write buffer 310 handles all write accesses unless write buffer 310 is busy retiring data (i.e., the WBret signal is high). If write buffer 310 is constructed using DRAM cells, the write buffer 310 will not handle write accesses if a refresh is pending in the write buffer (i.e., the REFP[w] signal is high). Therefore, the write buffer write enable signal WBwr is activated high when the WEN signal is high and the WBret signal is low (and the REFP[w} signal, is present, is low). This logic function is implemented by AND gate 815.

Memory Read-Write Controller 603

Figure 9:
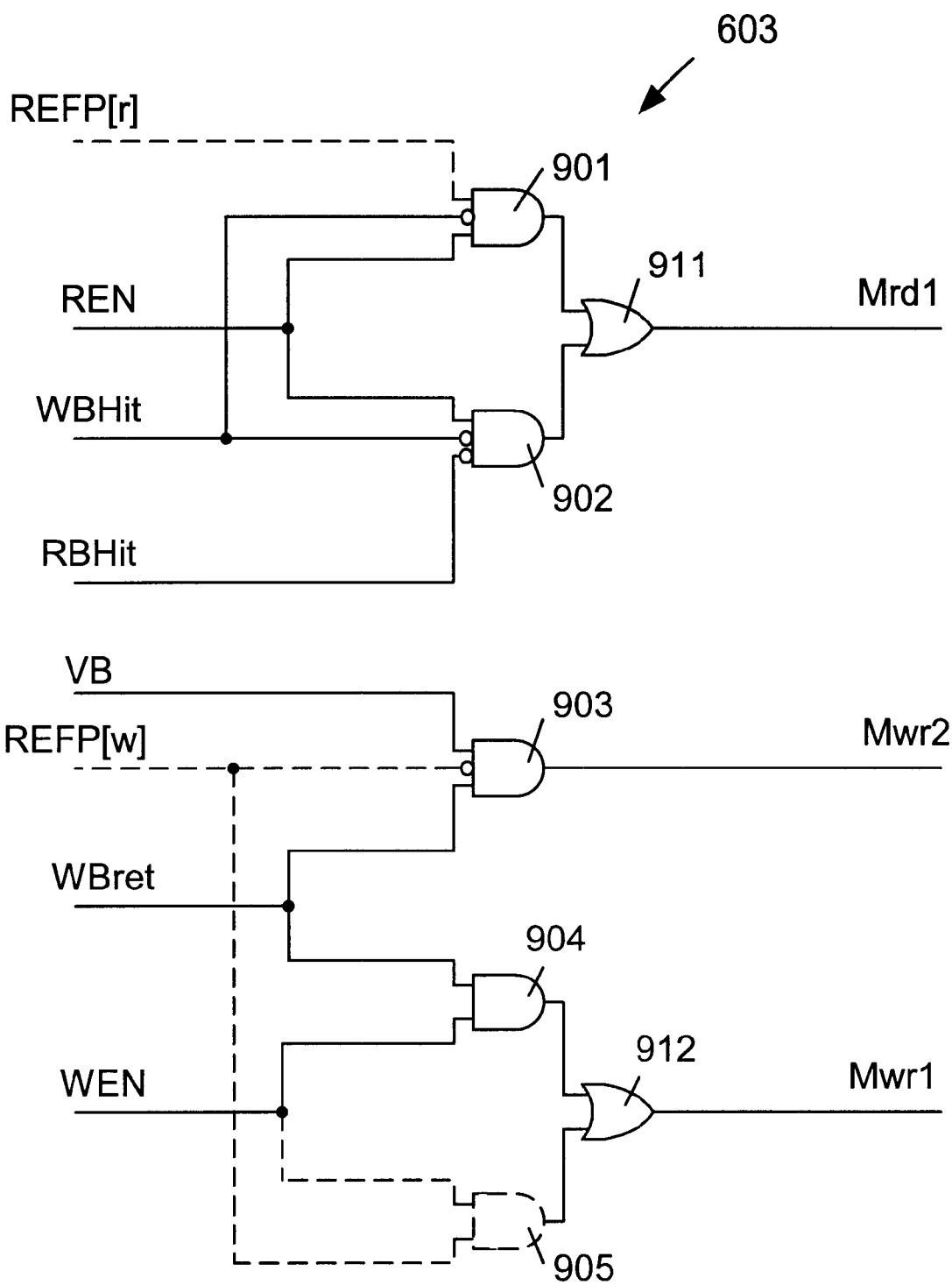
FIG. 9 is a circuit diagram of a memory read-write controller in accordance with one embodiment of the present invention.

FIG. 9 is a circuit diagram of memory read-write controller 603 in accordance with one embodiment of the present invention. Memory read-write controller 603 includes AND gates 901–905 and OR gates 911–912. Memory read-write control 603 is responsible for activating read and write accesses to memory blocks 1000–1127. Memory read-write controller 603 also directs the transfer of data between write-only port 312, read-write port 313 and memory blocks 1000–1127. These functions are accomplished by the generation of the memory read enable signal Mrd1 and memory write enable signals Mwr1 and Mwr2. As described in more detail below, memory read enable signal Mrd1 enables a read operation to read-write port 313, memory write enable signal Mwr1 enables a write operation to read-write port 313, and memory write enable signal Mwr2 enables a write operation to write-only port 312.

A memory read operation is performed when a read access misses both write buffer 310 and read buffer 311. This condition is indicated when the RBhit signal is low, the WBHit signal is low, and the REN signal is high. AND gate 902 and OR gate 911 are configured to generate a logic high memory read enable signal Mrd1 under these conditions. When the Mrd1 signal is high, the memory bank designated by the bank address BA[n] performs a memory read access through read-write port 313.

If read buffer 311 is constructed using DRAM cells, then a memory read operation is also performed if a read access occurs when there is a refresh pending in read buffer 311, and the read access misses write buffer 310. This condition is indicated when both the REN signal and the REFP[r] signal are high and the WBHit signal is low. The REFP[r] signal is added to AND gate 901 (as indicated by dashed lines) to generate the Mrd1 signal under these conditions. Again, when the Mrd1 signal is asserted high, the memory bank designated by the bank address BA[n] performs a memory read access through read-write port 313.

A memory write operation is performed through write-only port 312 when data is retired from write buffer 310 to memory banks 1000–1127. This condition is indicated when the WBret and VB signals both have logic high values. AND gate 903 is configured to generate a logic high Mwr2 signal under these conditions. When the Mwr2 signal is high, data is retired from write buffer 310 to the memory bank indicated by the write buffer bank address WBBA[6:0].

If write buffer 310 is constructed using DRAM cells, then the Mwr2 signal is not asserted high if there is a pending refresh in write buffer 310 (i.e., the REFP[w] signal is high). In this case, the REFP[w] signal is added to AND gate 903 (as indicated by dashed lines) to generate the Mwr2 signal.

A memory write operation is performed through read-write port 313 when write buffer 310 cannot handle an external write access. This condition exists when a write access occurs during write buffer retiring. This condition is indicated when the WBret and WEN signals are both in the logic high state. AND gate 904 and OR gate 912 are configured to generate a logic high Mwr1 signal under these conditions. When the Mwr1 signal is high, data is written to the memory bank designated by the bank address BA[n] through read-write port 313.

If write buffer 310 is constructed using DRAM cells, a memory write operation is also performed through read-write port 313 in response to a write access when a refresh is pending in write buffer 310. This condition is indicated by a logic high WEN signal and a logic high REFP[w] signal. To implement this function, AND gate 905 is added (as indicated by dashed lines). AND gate 905 and OR gate 912 are configured to generate a logic high Mwr1 signal under these conditions. Again, when the Mwr1 signal is high, data is written to the memory bank designated by the bank address BA[n] through read-write port 313.

Organization of Memory Blocks 1100–1127

Figure 10:
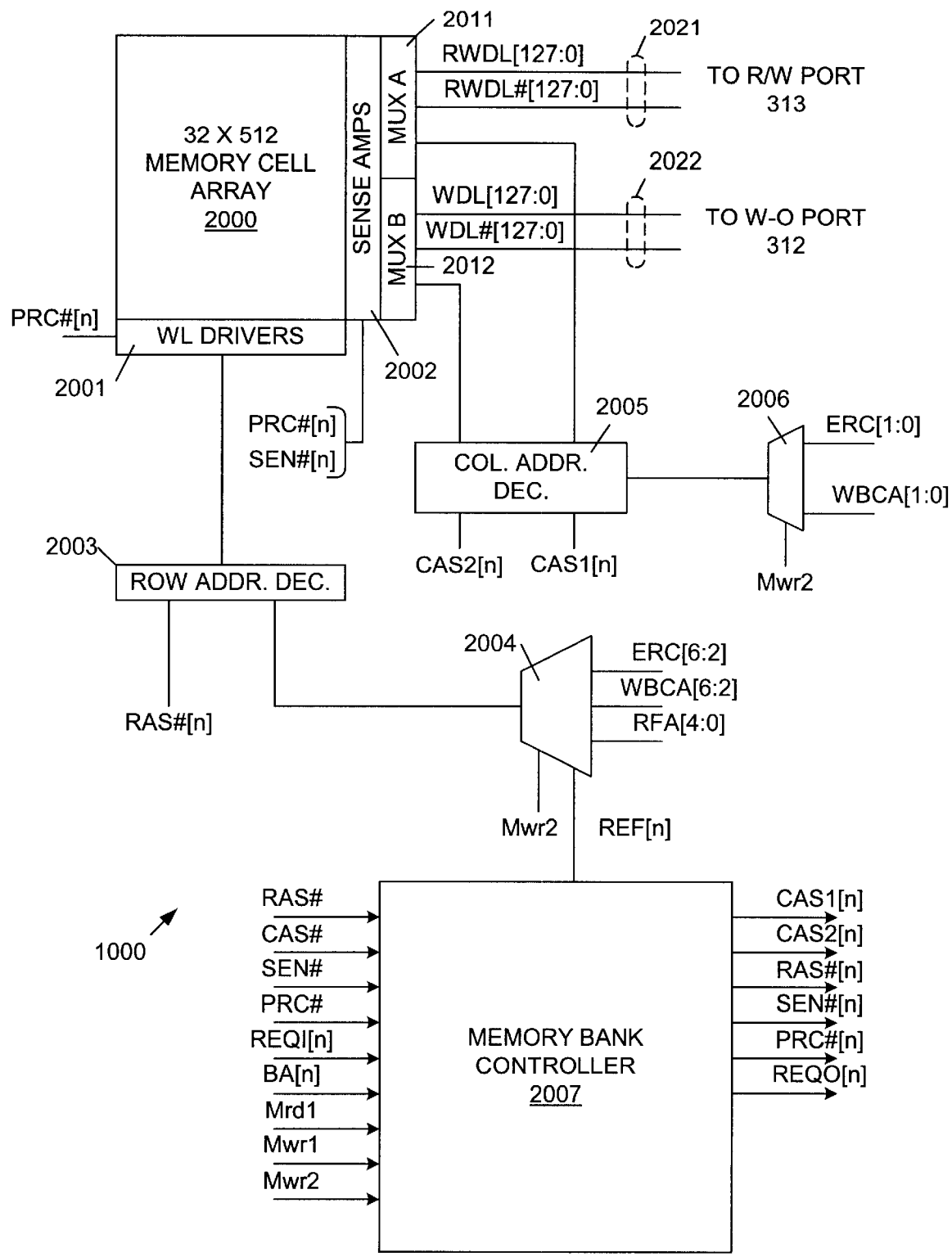
FIG. 10 is a block diagram of a memory block of the 1-T SRAM system of FIG. 5 in accordance with one embodiment of the present invention.

FIG. 10 is a block diagram of memory block 1000 in accordance with one embodiment of the present invention. In the described embodiment, memory blocks 1001–1127 are identical to memory block 1000. Memory block 1000 includes a memory array 2000 having 32 rows and 512 columns of memory cells. Memory array 2000 consists of ordinary DRAM cells with one transistor and one capacitor. Memory block 1000 completes a RAS cycle or a memory cycle in one cycle of the Clk signal. Therefore, memory block 1000 can process one random access or a row refresh in one clock cycle. During memory operations, one of memory blocks 1000–1127 can communicate to one of ports 312–313 while another one of memory blocks 1000–1127 communicates with the other one of ports 312–313.

Memory block 1000 includes all the conventional circuits associated with a DRAM array such as word line drivers 2001 and sense amplifiers 2002. Memory block 1000 also includes row address decoder 2003, row address multiplexer 2004, column address decoder 2005, column address multiplexer 2006, memory bank controller 2007 and two sets of column multiplexers 2011 and 2012. Column multiplexer 2011 connects sense amplifiers 2002 to read-write port 313 and column multiplexer 2012 connects sense amplifiers 2002 to write-only port 312.

Column multiplexers 2011 and 2012 are controlled by column address decoder 2005. Column address decoder 2005 decodes the column address received from column address multiplexer 2006. Column address multiplexer 2006 selects the write buffer retiring entry address WBCA[1:0] during write buffer retiring. Column address multiplexer 2006 selects the external row-column address ERC[1:0] when there is no write buffer retiring. Column address decoder 2005 enables, at most, one of column multiplexers 2011 and 2012 in response to the CAS1[n] and CAS2[n] signals. As described in more detail below, the CAS1[n] and CAS2[n] signals are generated by memory bank controller 2007.

Row address decoder 2003 activates the word line designated by the output of row address multiplexer 2004. Row address multiplexer 2004 is controlled by the Mwr2 signal and the local refresh signal REF[n]. In the default mode when both the REF[n] and Mwr2 signals are low, row address multiplexer 2004 is controlled to route external row-column address ERC[6:2] to row address decoder 2003. When memory block 1000 is handling write buffer retiring, the Mwr2 signal is high, and row address multiplexer 2004 is controlled to route write buffer retiring entry address WBCA[6:2] to row address decoder 2003. When memory block 1000 is handling a refresh operation, the REF[n] signal is high, and row address multiplexer 2004 is controlled to route refresh address RFA[4:0] to row address decoder 2003.

The operations of memory cell array 2000 (such as word line enable, sense amplifier enable, column switch enable and bit line pre-charge enable) are controlled by the local signals RAS#[n], SEN#[n], CAS#[n], and PRC#[n] generated by memory bank controller 2007. The functions of these signals are described in commonly owned, U.S. Pat. No. 6,078,547, which is hereby incorporated by reference in its entirety. Activation of the RAS#[n] signal deactivates the bit-line equalization and activates row address decoder, which results in the activation of a word line selected by the row address. Activation of the SEN#[n] signal causes the activation of the sense amplifiers in the memory bank. Activation of the CAS1[n] signal causes the sense amplifiers 2002 to be coupled to read-write port 313 through column multiplexer 2011 and data bus 2021, which carries data signals RWDL[127:0] and complementary data signals RWDL#[127:0] in a bi-directional manner. Data bus 2021 is connected in parallel to memory blocks 1001–1127 in a similar manner.

Similarly, activation of the CAS2[n] signal causes sense amplifiers 2002 to be coupled to write-only port 312 through column multiplexer 2012 and data bus 2022, which carries data signals WDL[127:0] and complementary data signals WDL#[127:0] in a uni-directional manner. Data bus 2022 is connected in parallel to memory blocks 1001–1127 in a similar manner.

Activation of the PRC#[n] signal turns off multiplexers 2011 and 2012, turns off the activated word line, deactivates sense amplifiers 2002 and activates bit-line equalization circuitry (not shown).

Memory Bank Controller 2007

Figure 11:
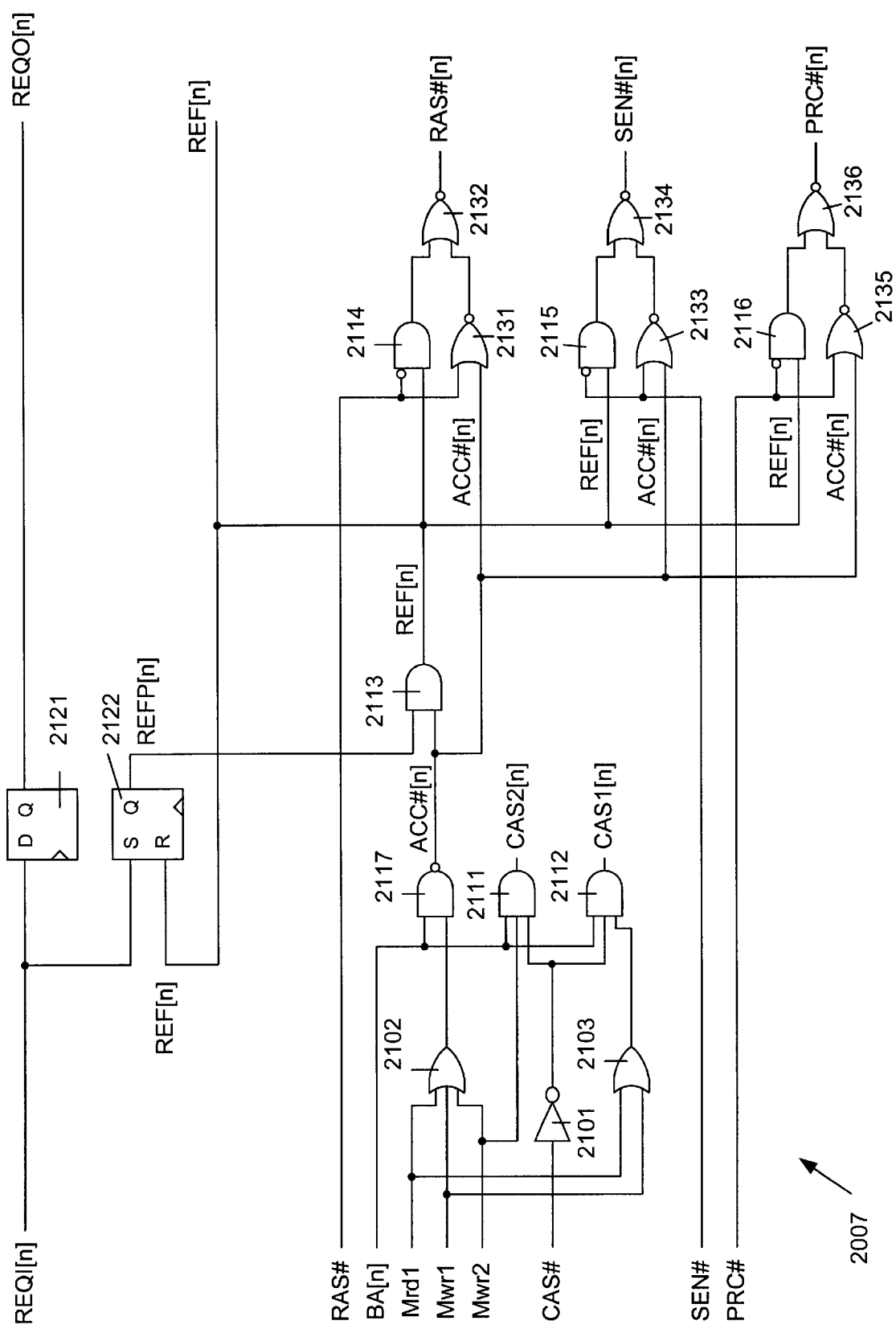
FIG. 11 is a circuit diagram of a memory bank controller of the memory block of FIG. 10 in accordance with one embodiment of the present invention.

FIG. 11 is a circuit diagram of memory bank controller 2007 in accordance with one embodiment of the present invention. Memory bank controller 2007 includes inverter 2101, OR gates 2102–2103, AND gates 2111–2116, NAND gate 2117, D-register 2121, R-S register 2122, and NOR gates 2131–2136.

As described above, the input refresh request signal REQI[n] is latched into D-register 2121 in response to the rising edge of the Clk signal. D-register 2121 provides an output refresh request signal REQO[n] to the adjacent memory block in a daisy-chained manner.

The input refresh request signal REQI[n] is also provided to the set terminal of R-S register 2122. When the input request signal REQI[n] has a logic high value, indicating that a refresh should be performed in memory block 1000, a rising edge of the Clk signal will latch a logic high value into R-S register 2122. This logic high value is provided at the output terminal of R-S register 2122 as the local refresh pending signal REFP[n]. The REFP[n] signal remains high until reset by a logic high local refresh signal REF[n] that indicates the pending refresh has been performed.

The local RAS#[n], SEN#[n], and PRC#[n] signals are triggered by the global timing control signals RAS#, SEN#, and PRC#, respectively. Similarly, the local CAS1[n] and CAS2[n] signals are triggered by the global timing control signal CAS#. The global timing control signals RAS#, CAS#, SEN#, and PRC# are generated by timing sequencer 303 in FIG. 5. The construct of timing sequencer 303 is similar to the timing sequencer described in U.S. Pat. No. 6,078,547, and therefore generates global timing control signals having fixed phase relationships. Memory sequencer 303 is activated every cycle of the Clk signal. As a result, the global timing signals RAS#, CAS#, SEN#, and PRC# are generated every clock cycle.

The enabling of the RAS#[n], SEN#[n], and PRC#[n] signals is also controlled by a local access enable signal ACC#[n] and a local refresh enable signal REF[n]. The ACC#[n] signal is activated low when any of the memory read-write enable signals Mrd1, Mwr1, and Mwr2 is high and the bank activation signal BA[n] is high. This logic function is implemented by OR gate 2102 and NAND gate 2117. As described above, a logic high Mrd1 signal indicates a memory read operation to be carried out on read-write port 313. A logic high Mwr1 signal indicates a memory write operation to be performed on read-write port 313. Similarly, a logic high Mwr2 signal indicates a memory write operation to be performed on write-only port 312. The BA[n] signal is activated high when memory block [n] is designated for external access or targeted for data retiring.

The local refresh enable signal REF[n] is activated high when there is a pending refresh (i.e., the refresh pending signal REFP[n] is high) and there is no pending access request to the memory block (i.e., the ACC#[n] signal is high). This logic function is implemented by AND gate 2113. The high state of the REF[n] signal resets the output of R-S flip-flop 2122 at next rising edge of the Clk signal, thereby canceling the pending refresh after the refresh operation has been performed.

The CAS1[n] signal is enabled when memory block 1000 is accessing read-write port 313. More specifically, the CAS1[n] signal is enabled when the CAS# signal is asserted low, either one of the Mrd1 or Mwr1 signals is activated high and the bank access signal BA[n] is activated high. This logic function is implemented by inverter 2101, OR gate 2103 and AND gate 2112.

The CAS2[n] signal is enabled when memory block 1000 is accessed through write-only port 312. More specifically, the CAS2[n] signal is enabled when the CAS# signal is asserted low, the Mwr2 signal is activated high and the bank access signal BA[n] is activated high. This logic function is implemented by inverter 2101, and AND gate 2111.

The local RAS#[n] signal is asserted low when the global RAS# signal is asserted low, a refresh operation is pending (i.e., refresh signal REFP[n] is asserted high), and there is no read or write access to memory block 1000 (i.e., the ACC#[n] signal is de-asserted high). This logical function is implemented by AND gates 2113–2114.

The local RAS#[n] signal is also asserted low when the global RAS# signal is asserted low, and a local access is pending (i.e, the ACC#[n] signal is asserted low). This logical function is implemented by NOR gates 2131–2132.

The local SEN#[n] signal is asserted low in response to the global SEN# signal, the refresh pending signal REFP[n] and the local access signal ACC#[n] in a manner similar to the local RAS# signal. The local SEN#[n] signal is generated by AND gate 2115 and NOR gates 2133–2134.

The local PRC#[n] signal is asserted low in response to the global PRC# signal, the local refresh pending signal REFP[n] and the local access signal ACC#[n] in a manner similar to the local RAS# signal. The local PRC#[n] signal is generated by AND gate 2116 and NOR gates 2135–2136.

Organization Write Buffer 310

Figure 12:
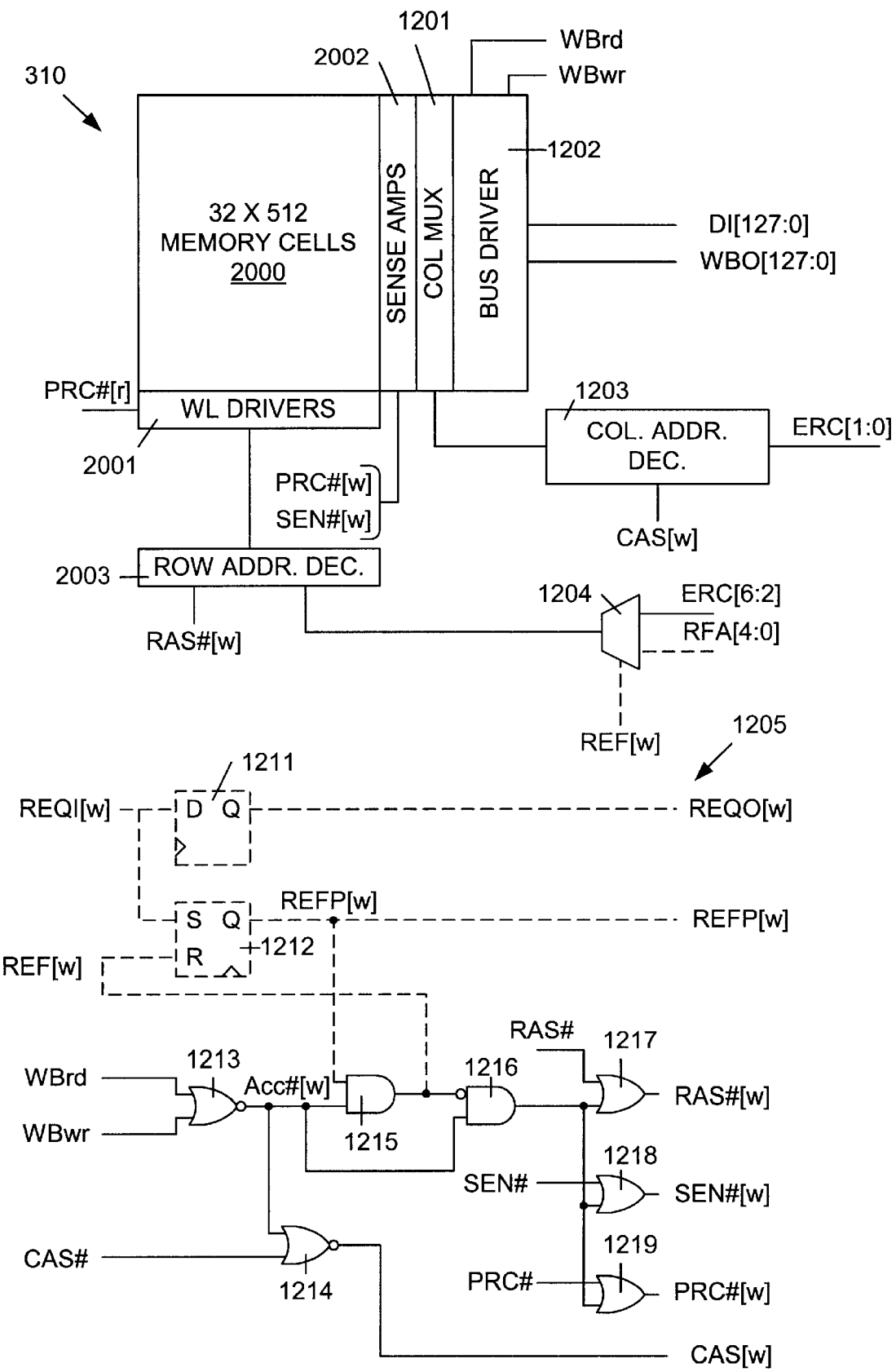
FIG. 12 is a block diagram of the write buffer of the 1-T SRAM system of FIG. 5 in accordance with one embodiment of the present invention.

FIG. 12 is a block diagram illustrating write buffer 310. Because write buffer 310 is similar to memory block 1000 (FIG. 10), similar elements in FIGS. 10 and 12 are labeled with similar reference numbers. Thus, write buffer 310 includes memory array 2000, word line drivers 2001, sense amplifiers 2002 and row address decoder 2003. Write buffer 310 also includes column multiplexer 1201, bus driver circuit 1202, column address decoder 1203, row address multiplexer 1204 and write buffer controller 1205. Write buffer controller 1205 includes D-register 1211, R-S register 1212, NOR gates 1213–1214, AND gates 1215–1216 and OR gates 1217–1219.

Column multiplexer 1201 is controlled by column address decoder 1203. Column address decoder 1203 decodes the external column address ERC[1:0] when the local column access signal CAS[w] is asserted high. As described in more detail below, the CAS[w] signal is generated by write buffer controller 1205.

Row address decoder 2003 activates the word line designated the by external row address ERC[6:2]. If write buffer 310 is constructed using DRAM cells, then row address decoder may be controlled to activate a word line designated by the refresh address RFA[4:0]. Thus, when write buffer 310 is being refreshed, row address multiplexer 1204 is controlled to route the refresh address RFA[4:0] to row address decoder 2003. At all other times, row address multiplexer 1204 is controlled to route external row address ERC[6:2] to row address decoder 2003.

The operations of write buffer 310 (such as word line enable, sense amplifier enable, column switch enable and bit line pre-charge enable) are controlled by the local signals RAS#[w], SEN#[w], CAS[w] and PRC#[w] generated by write buffer controller 1205. These local signals function in a manner similar to local signals RAS#[n], SEN#[n], CAS#[n] and PRC#[n]. The notation [w] indicates that the signal is associated with write buffer 310.

Bus driver circuit 1202 operates in response to the write buffer read enable signal (WBrd) and the write buffer write enable signal (WBwr) to couple column multiplexer 1201 to either data input bus Di[127:0] or write buffer output bus WBo[127:0]. A read access to write buffer 310 is carried out when the write buffer read enable signal (WBrd) is asserted. During a read access to write buffer 310, column multiplexer 1201 is coupled to write buffer output bus WBo[127:0]. A write access to write buffer 310 is carried out when the write buffer write enable signal (WBwr) is asserted. During a write access to write buffer 310, column multiplexer 1201 is coupled to data input bus Di[127:0].

Write buffer controller 1205 operates as follows. NOR gate 1213 asserts a logic low access enable signal Acc#[w] when either one of the WBrd and WBwr signals is asserted high. When the Acc#[w] signal is asserted low, a logic low global CAS# signal will cause NOR gate 1214 to assert a logic high CAS[w] signal. Also, when the Acc#[w] signal is asserted low, AND gate 1216 provides a logic low signal to OR gates 1217–1219, thereby routing the global RAS#, SEN# and PRC# signals as the local RAS#[w], SEN#[w] and PRC#[w] signals, respectively. As a result, an access operation is performed in write buffer 310.

When neither one of the WBrd nor WBwr signals is asserted high, the Acc#[w] signal is de-asserted high, thereby indicating that write buffer 310 is not being accessed. Under these conditions, the RAS#[w], CAS[w], SEN#[w] and PRC#[w] signals are de-asserted, thereby disabling access to write buffer 310.

If write buffer 310 is constructed using DRAM cells, then D-register 1211 and R-S register 1212 are provided to enable write buffer refresh operations. These elements are shown in dashed lines, as these elements are only required if a write buffer refresh operation is required. D-register 1211 is coupled to receive input refresh request signal REQI[w] from memory block 1127. The rising edge of the Clk signal latches this input refresh signal, thereby providing an output refresh request signal REQO[w] (which is provided to read buffer 311).

The input refresh request signal REQI[w] is also provided to the set input terminal of R-S register 1212. When the REQI[w] signal is asserted high at the Clk signal rising edge, R-S register 1212 is set, thereby providing a logic high write buffer refresh pending signal REFP[w]. The logic high REFP[w] signal indicates there is a refresh pending in write buffer 310. The REFP[w] signal remains high until reset by a logic high local refresh signal REF[w] that indicates that the pending refresh has been performed.

When the REFP[w] signal is asserted high, a pending refresh operation can be performed within write buffer 310. If the Acc#[w] signal is de-asserted high and the REFP[w] signal is asserted high, then AND gate 1216 provides a logic high REF[w] signal. In response, AND gate 1216 provides a logic low signal to OR gates 1217–1219, thereby routing the global RAS#, SEN# and PRC# signals as the local RAS#[w], SEN#[w] and PRC#[w] signals, respectively. The logic high Acc#[w] signal prevents the CAS[w] signal from being asserted high. As a result, a refresh operation is performed in write buffer 310. Note that the logic high REF[w] signal resets R-S register 1212 at the next rising edge of the Clk signal.

If the Acc#[w] signal is de-asserted high, and there is no pending refresh (i.e., the REFP[w] signal is low), then AND gate 1216 will provide a logic high signal to OR gates 1217–1219. Under these conditions, the local RAS#[w], SEN#[w] and PRC#[w] signals are all de-asserted high, and the CAS[w] signal is de-asserted low, thereby inhibiting access to write buffer 310.

Organization Read Buffer 311

Figure 13:
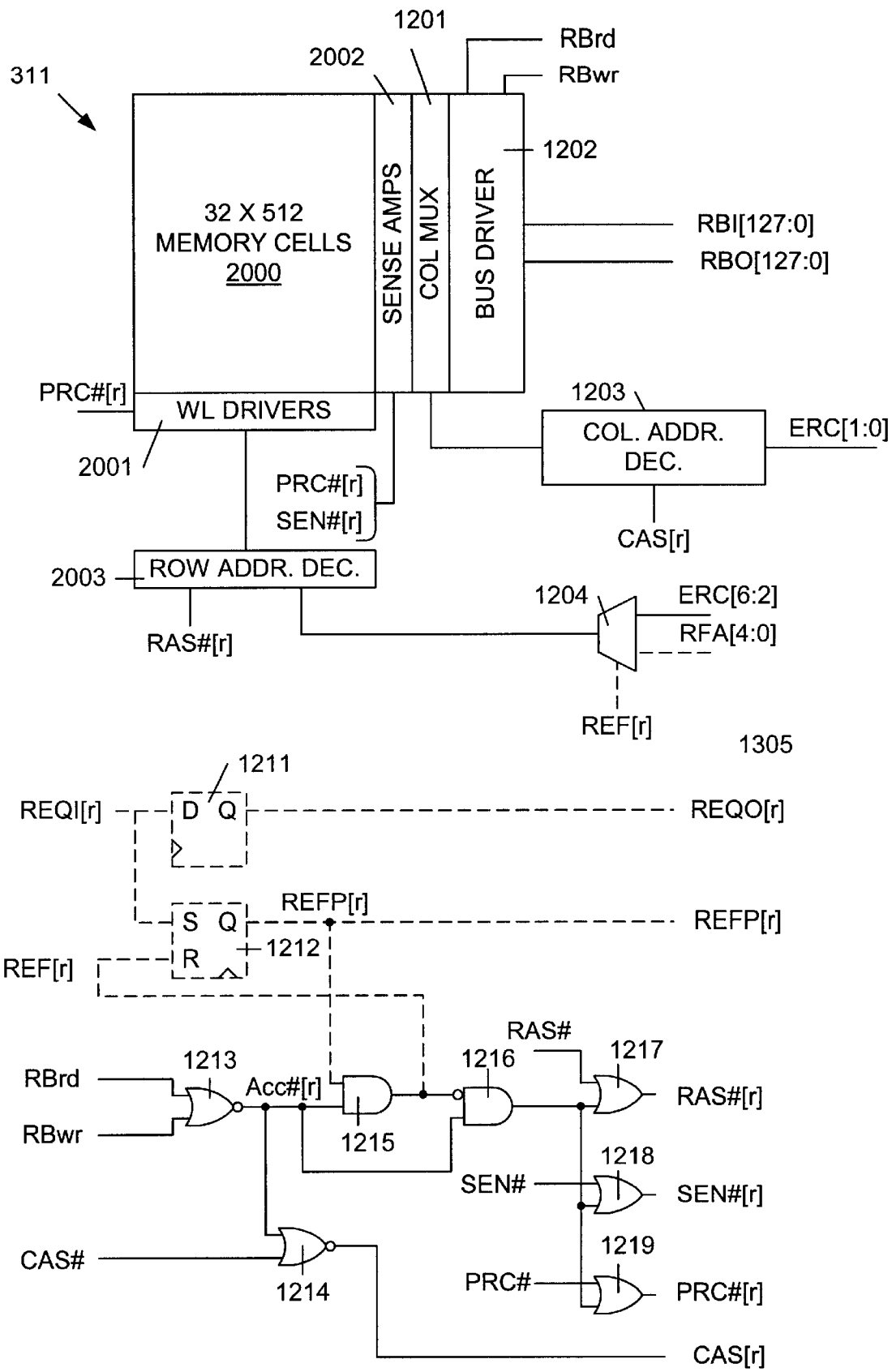
FIG. 13 is a block diagram of the read buffer of the 1-T SRAM system of FIG. 5 in accordance with one embodiment of the present invention.

FIG. 13 is a block diagram illustrating read buffer 311. Because read buffer 311 is similar to write buffer 310 (FIG. 12), similar elements in FIGS. 12 and 13 are labeled with similar reference numbers. Thus, read buffer 310 includes memory array 2000, word line drivers 2001, sense amplifiers 2002, row address decoder 2003, and column multiplexer 1201, bus driver circuit 1202, column address decoder 1203, row address mulitplexer 1204 and read buffer controller 1305. Read buffer controller 1305 includes D-register 1211, R-S register 1212, NOR gates 1213–1214, AND gates 1215–1216 and OR gates 1217–1219.

Read buffer 311 operates in a manner similar to write buffer 310, but with signals specific to read buffer 311. Thus, bus driver 1202 of read buffer 311 operates in response to the read buffer read enable signal RBrd and the read buffer write enable signal RBwr. Similarly, bus driver 1202 of read buffer 311 is coupled to read buffer input bus RBI[127:0] and read buffer output bus RBO[127:0]. In addition, D-register 1211 of read buffer 311 is coupled to receive the REQO[w] signal as input refresh request signal REQI[r]. The notation "[r]" identifies the various signals as being associated with the read buffer.

Read Access Timing

Figure 14:
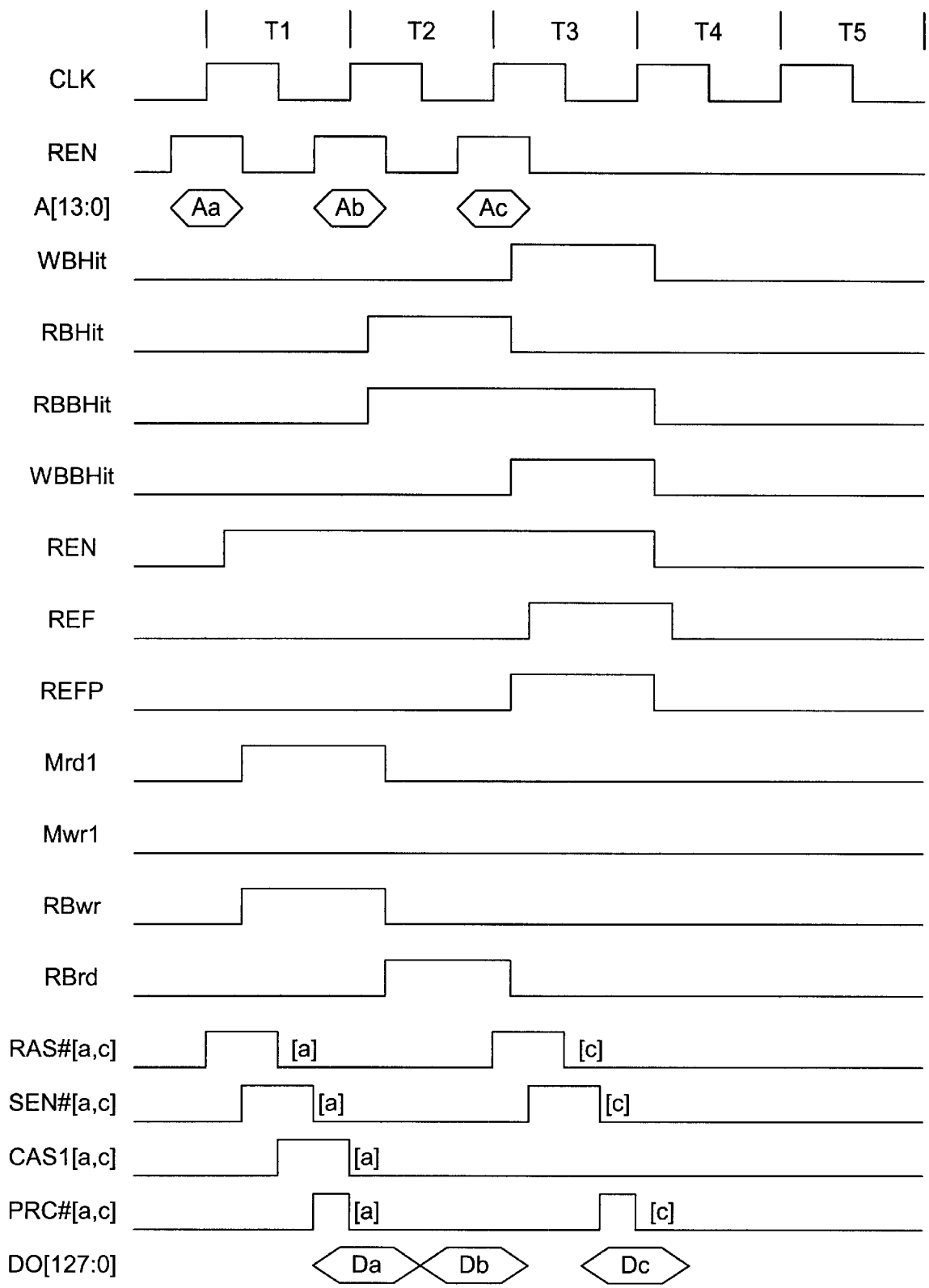
FIG. 14 is a waveform diagram illustrating control signal timing during three different read accesses to the 1-T SRAM system of FIG. 5 in accordance with one embodiment of the present invention.

FIG. 14 is a waveform diagram illustrating the timing of the control signals during three different memory read accesses. The first read access, with external address Aa, illustrates the case of a read buffer miss and write buffer miss when there is no pending refresh. The second read access, with external address Ab, illustrates the case of a read buffer hit. The third read access, with external address Ac, illustrates the case of a read buffer miss and a write buffer hit.

In the first read access, the external read enable signal Ren is asserted high. The logic high state of the Ren signal is detected and latched in D-register 721 (FIG. 7) at the rising edge of clock cycle T1. The external access address Aa[13:0] is latched in address register 304 (FIG. 5) at the rising edge of clock cycle T1. The bank address Aa[13:7] (i.e., EBA[6:0]) is gated to bank address decoder 305 (FIG. 5), as well as to comparators 741–742 and the read and write buffer tag registers 762 and 772 in read-write tag controller 602 (FIG. 7).

Bank address decoder 305 activates the bank access signal BA[a] by driving the corresponding external bank-select signal EBS[a] high, where 'a' is the bank corresponding with address Aa. Within read-write tag controller 602, comparator 741 compares bank address Aa[13:7] with the read buffer tag stored in read cache memory 762. Because there is no hit, comparator 741 provides a logic low RBBHit signal, thereby resulting in a logic low RBHit signal. Similarly, comparator 742 compares bank address Aa[13:7] with the write buffer tag stored in write cache memory 772. Because there is no hit, comparator 742 provides a logic low WBBHit signal.

The read buffer write enable signal RBwr is asserted high in response to the low state of the RBHit signal and the high state of the REN signal. (See, inverter 801, AND gate 813 and OR gate 821 in FIG. 8.) The memory read enable signal Mrd1 is also asserted high in response to the RBHit and REN. (See, AND gates 901–902 and OR gate 911, FIG. 9.)

Memory sequencer 303 generates the global memory timing signals RAS#, SEN#, CAS# and PRC# in response to the rising edge of the Clk signal. In the addressed memory block [a], the logic high BA[a] and Mrd1 signals cause the local access enable signal ACC#[a] to be asserted low. (See, OR gate 2102 and NAND gate 2117, FIG. 11.) The low state of the ACC#[a] signal causes the local refresh signal REF[a] to have a logic low value. (See, AND gate 2113, FIG. 11.) The logic low ACC#[a] and REF[a] signals enable the memory bank timing control signals RAS#[a], SEN#[a], CAS1[a], and PRC#[a] to be activated by the corresponding global signals RAS#, SEN#, CAS# and PRC#.

Activation of the RAS#[a] signal activates the row address decoder 2003 (FIG. 10) and subsequently activates the word line designated by the row address Aa[6:2] (i.e., ERC[6:2]) causing data stored in the designated row of the memory array to be loaded to the bit lines. Activation of the SEN#[a] signal latches the data in the bit line in sense amplifiers 2002. Activation of the CAS1[a] signal enables column address decoder 2005, the output of which selects the 128-bit word designated by the column address in Aa[1:0] (i.e., ERC[1:0]) for output to read-write port 313. The data Da is then driven from read-write port 313 to read buffer 310, and through output multiplexer 309 to data output bus Do[127:0].

Because the first read access misses both write buffer 310 and read buffer 311, the WBHit signal and the RBHit signal are both low. In response, output multiplexer 314 routes the data on read-write port output bus RWPO[127:0] to read buffer 311. In read buffer 311, the high state of the read buffer write enable signal RBwr causes the data to be written to the location designated by the address Aa[6:0] (i.e., ERC[6:0]) at the end of the clock cycle T1. In read-write buffer tag controller 602 (FIG. 7), the high state of the RBwr signal causes the bank address Aa[6:0] (i.e., EBA[6:0]) to be written to the read buffer tag memory 762. The high state of the RBwr signal and the low state of the RBBHit signal cause all of the valid bits, except the one designated by the address in Aa[6:0], to be reset. The valid bit associated with the address Aa[6:0] is set to a logic '1' value.

The second read access to address Ab[13:0] is detected at the rising edge of the Clk signal at the beginning of cycle T2. The high state of the external Ren signal is latched by D-register 721 (FIG. 7), thereby driving the local read enable signal REN high. The second read access hits the read buffer. Therefore, at the beginning of clock cycle T2, read comparator 741 detects a match between address Ab[6:0] (i.e., EBA[6:0]) and the read cache tag (i.e., Aa[6:0]) stored in read cache tag memory 762. In response, comparator 741 drives the RBBHit signal high. Address Ab[6:0] also causes 128-to-1 multiplexer 751 to route the logic '1' valid bit stored in read valid bit memory 761 as the RBValid signal.

As a result, the read buffer hit signal RBHit is driven high. (See, AND gate 704).

Within read-write data buffer controller 601 (FIG. 8), the logic high REN and RBHit signals activate the read buffer read enable signal RBrd and causes a read operation to be carried out in read buffer 311. The data Db designated by address Ab[6:0] is read out from read buffer 311 to read buffer output bus RBO[127:0]. The high state of the RBHit signal and the low state of the WBHit and REFP[r] signals causes output multiplexer 309 to route the data on output bus RBO[127:0] to the output data bus Do[127:0]. In the memory read-write control 603, the memory bank read signal Mrd1 is driven low because of the high state of the RBHit signal. As a result, the memory blocks 1000–1127 do not perform any operations for the second read access. If there are refresh operations pending in any of memory blocks 1000–1127 during clock cycle T2, then these refresh operations are performed during clock cycle T2. If the second read access hits write buffer 310 in addition to read buffer 311 (and there is no refresh pending in read buffer 311), only a read operation will be performed in read buffer 311 and multiplexer 309 will select data from read buffer 311 for output to output data bus Do[127:0].

The third read access to address Ac[13:0] is detected at the rising edge of the Clk signal at the beginning of cycle T3. The high state of the external Ren signal is latched by D-register 721 (FIG. 7), thereby driving the local read enable signal REN high. The third read access misses read buffer 311 and hits write buffer 310. At the beginning of clock cycle T3, the read access is detected, and the external access address Ac[13:0] of the third read access is latched into address register 304 (FIG. 5). In the described example, the external bank address Ac[13:7] matches the read cache tag stored in read cache memory 762 and the write cache tag stored in write cache memory 772 (FIG. 7). As a result, comparators 741 and 742 drive the RBBHit and WBBHit signals to logic high values. In the described example, the address Ac[3:0] points to a reset (i.e., logic low) valid bit in read valid memory 761. However, the address Ac[3:0] points to a set (i.e., logic high) valid bit in write valid memory 771. Consequently, output of multiplexer 751, RBValid, is driven low and output of multiplexer 752, WBValid is driven high. The low state of the RBValid signal causes the RBHit signal to go low, indicating the condition of a read buffer miss. The high states of the WBValid and WBBHit signals cause the WBHit signal to go high, thereby indicating the condition of write buffer hit. The low state of the RBHit signal and the high state of the REN signal activate the read buffer write enable RBwr signal (See, AND gate 813 and OR gate 821 in read-write buffer controller 601, FIG. 8). Similarly, the low state of the RBHit signal and the high state of the WBHit and REN signals activate the write buffer read enable WBrd signal (See, AND gate 811 and OR gate 824 of read-write buffer controller 601, FIG. 8). The activation of the WBrd signal causes a read operation to be carried out in write buffer 310. Data, Dc, designated by the access address Ac[6:0] is read from write buffer 310 to the write buffer output bus WBO[127:0]. The activation of the WBHit signal and the low state of the RBHit signal causes multiplexer 309 to drive data from bus WBO[127:0] to data output bus Do[127:0]. The high state of the WBHit signal also causes multiplexer 314 to drive data from bus WBO[127:0] to the read buffer input data bus RBI[127:0]. The high state of the RBwr signal causes the data on the read buffer input data bus RBI[127:0] to be written to the entry of read buffer 311 designated by the address Ac[6:0] (FIG. 13). The high state of the RBBHit signal and the high state of the RBwr signal causes the valid bit in read valid memory 761 associated with the access address Ac[6:0] to be set.

The memory bank addressed by external address Ac[13:0] is designated as memory bank [c]. Assume a refresh request is detected in memory bank [c] with the activation of the REQI[c] signal during the Clk cycle T3. The high state of the REQI[c] signal sets R-S register 2122 on the rising edge of the Clk signal, thereby providing a logic high internal refresh pending signal REFP[c] (FIG. 11). The high state of the refresh pending signal REFP[c], the high state of the bank access signal BA[c] and the logic low states of the Mrd1, Mwr1 and Mwr2 signals cause the internal refresh signal REF[c] to go high. (See, FIGS. 9 and 11). The high state of the refresh signal REF[c] enables the memory array timing signals RAS#[c], SEN#[c] and PRC#[c] to be triggered by the corresponding global timing signals RAS#, SEN# and PRC# generated by memory sequencer 303 (FIG. 5). A refresh cycle is thus carried out by memory bank [c]. Notice that column switch control signals CAS1[c] and CAS2[c] are not activated during a refresh cycle, as data in the sense amplifiers are not accessed. The logic low Mrd1, Mwr1 and Mwr2 signals prevent the CAS1[c] and CAS2[c] signals from being activated. (See, FIG. 11, AND gates 2111 and 2112.) When a read access hits write buffer 310 or read buffer 311, data is read from write buffer 310 or read buffer 311, thereby allowing memory blocks 1000–1127 banks to perform refresh operations during this time.

Write Access Timing

Figure 15:
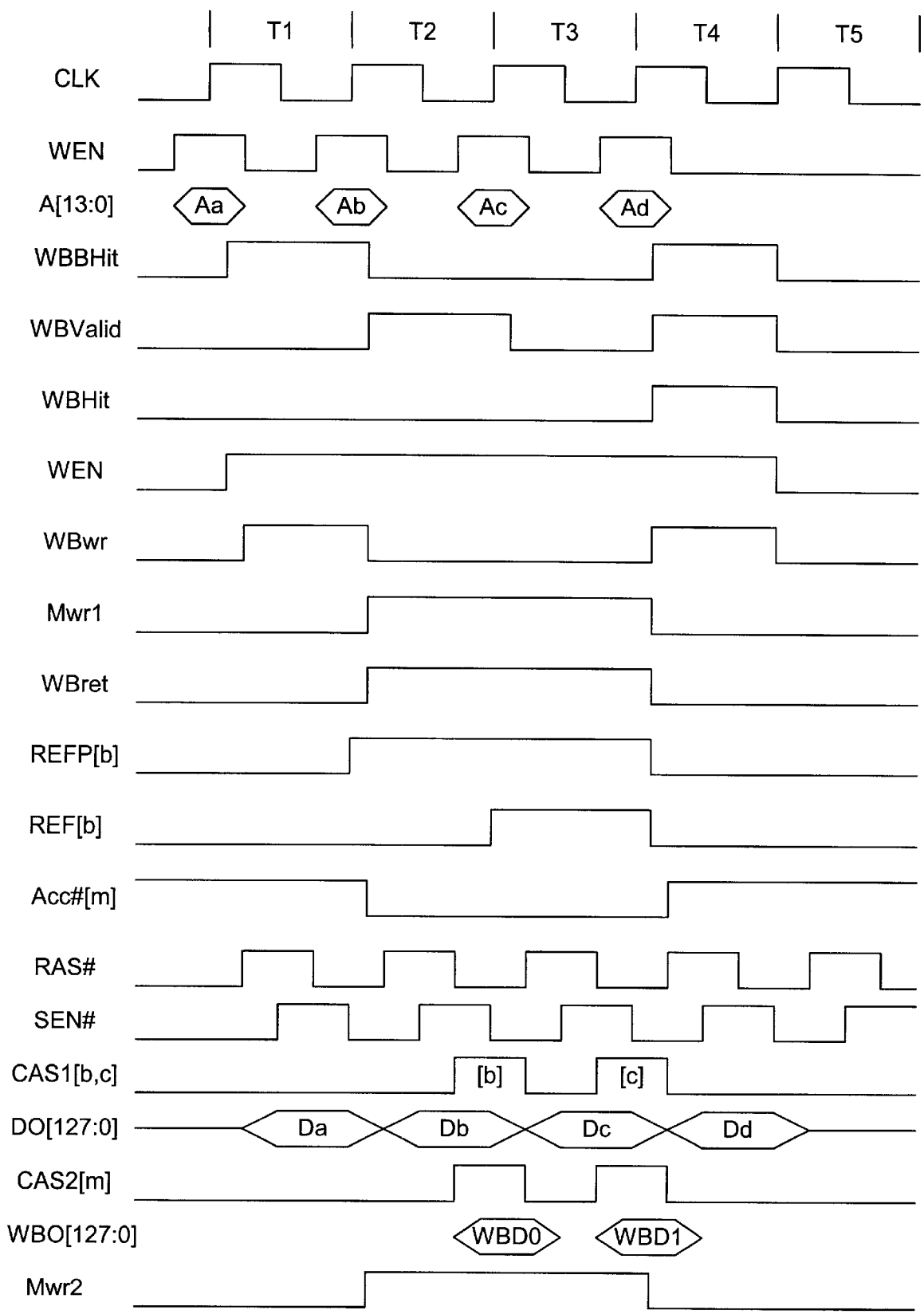
FIG. 15 is a waveform diagram illustrating control signal timing during four different write accesses to the 1-T SRAM system of FIG. 5 in accordance with one embodiment of the present invention.

FIG. 15 is a waveform diagram illustrating the timing of the control signals during four different memory write accesses. The first write access, with external address Aa, illustrates the case of a write buffer hit. The second write access, with external address Ab, illustrates the case of a write buffer miss. The third write access, with external address Ac, illustrates the case of write buffer retiring in the presence of an external access. The fourth write access illustrates the termination of write buffer retiring when a write buffer hit occurs during the process of write buffer retiring.

The first write access to address Aa[13:0] is detected at the rising edge of the Clk signal at the beginning of cycle T1. In response, the access address Aa[13:0] is latched into address register 304. The high state of the external Wen signal is latched by D-register 722 (FIG. 7), thereby driving the local write enable signal WEN high. The bank address Aa[13:7] (i.e., EBA[6:0]) is gated to bank address decoder 305 (FIG. 5), as well as to comparators 741–742 and the read and write buffer tag registers 762 and 772 in read-write tag controller 602 (FIG. 7).

Bank address decoder 305 activates the bank access signal BA[a] by driving the corresponding external bank-select signal EBS[a] high, where 'a' is the bank corresponding with address Aa. Within read-write tag controller 602, comparator 742 compares bank address Aa[13:7] with the write buffer tag stored in write cache tag memory 772. Because there is a hit, comparator 742 provides a logic high WBBHit signal. In the present example, the entry of write valid memory 771 designated by address Aa[6:0] is reset (i.e., logic low). As a result, both the WBValid signal and the WBHit signal remain at logic low states. The high state of the WBBHit signal and the WEN signal causes the write buffer retire signal WBret to stay low. (See, AND gate 817, OR gate 823 and R-S register 833 of FIG. 8). The logic low WBret signal and the logic high WEN signal drives the WBwr signal to a logic high state. (See, AND gate 815 of FIG. 8). The low state of the WBret causes the Mwr1 signal to stay low, thereby suppressing any memory bank access. (See, AND gates 904–905 and OR gate 912 of memory read-write controller 603 of FIG. 9.)

In write buffer 310, the high state of the WBwr signal drives the Acc#[w] signal low, thereby causing the data Da on input data bus Di[127:0] to be written to the entry designated by the address Aa[6:0] (i.e., ERC[6:0]). (See, FIG. 12.) In read-write buffer tag control 602 (FIG. 8), the high state of the WBwr signal causes the bank address Aa[6:0] to be written to write buffer tag memory 772. Because the write buffer tag and bank address Aa[6:0] are the same, this operation does not result in any change in the write buffer bank address tag. The activation of the WBwr signal also activates the WBVupdate signal causing the valid bit designated by the external row-column address ERC[6:0] (i.e., Aa[6:0]) to be set in write valid memory 771.

The second write access to address Ab[13:0] is detected at the rising edge of the Clk signal at the beginning of cycle T2. In response, the access address Ab[13:0] is latched into address register 304. The high state of the external Wen signal is latched by D-register 722 (FIG. 7), thereby driving the local write enable signal WEN high. The bank address Ab[13:7] (i.e., EBA[6:0]) is gated to bank address decoder 305 (FIG. 5), as well as to comparators 741–742 and the read and write buffer tag registers 762 and 772 in read-write tag controller 602 (FIG. 7).

Comparator 742 compares the bank address Ab[13:7] with the write buffer tag stored in write buffer tag memory 772. A non-match condition is detected, thereby causing the WBBHit and WBHit signals to be de-asserted low. The WBHit signal is low even though the valid bit designated by the row and column address Ab[6:0] is set (i.e., WBValid is high). Since at least one valid bit in the write valid memory 771 is set high, output of OR gate 822 (FIG. 8) is driven high. This high signal, together with the high state of the WEN signal and the low state of the WBBHit signal, causes AND gate 818 to provide a logic high signal to the set terminal of R-S register 833. In response, R-S register 833 provides a logic high WBret signal, thereby causing write buffer retiring to start.

The high state of the WBret signal deactivates the WBwr signal. (See, AND gate 815 of FIG. 8.) The high state of the WBret signal, along with the logic high WEN signal, activates the Mwr1 signal. (See, AND gate 904 and OR gate 912 of FIG. 9.) In memory bank [b], the designated memory bank of the second write access, the high state of the Mwr1 signal causes the access enable signal Acc#[b] to go low. (See, OR gate 2102 and NAND gate 2117 of FIG. 11.) During this time, a refresh request is received and the refresh request signal REQI[b] is asserted high. In response, R-S register 2122 provides a logic high refresh pending signal REFP[b]. However, the low state of the Acc#[b] signal suppresses the refresh enable signal REF[b] from going high. The low state of the Acc#[b] signal allows the activation of RAS#[b], SEN#[b], and PRC#[b] by the corresponding input signals RAS#, SEN# and PRC#. (See, NOR gates 2131–2136 of FIG. 11.) The high state of the Mwr1 also allows the column multiplexer enable signal CAS1[b] to be activated by the global timing signal CAS#. (See, AND gate 2112 of FIG. 11.) The sequential activation of RAS#[b], SEN#[b], CAS1[b], and PRC#[b] carries out a memory write cycle in memory bank [b] resulting in writing the input data Db in Di[127:0] to memory bank [b] through the memory read-write port 313.

Write buffer retiring starts with entry 0, with the entry address WBCA[6:0] being provided by 7-bit counter 831 (FIG. 8). The entry address WBCA[6:0] is also provided to memory blocks 1000–1127, thereby providing the proper row and column address to the memory bank designated by the write buffer tag. Assuming the valid bit associated with entry 0 is set, then the valid bit signal VB is high. (See, multiplexer 832 of FIG. 8.) The logic high WBret and VB signals cause both the Mwr2 signal (FIG. 9) and the WBrd signal (FIG. 8) to be asserted high. The high state of the WBrd signal, in turn, causes a read cycle to be carried out in write buffer 310. Consequently, data from entry 0 of write buffer 310 is read out to data bus WBO[127:0].

Assuming that the bank address in write buffer tag 772 is [m], then in memory block [m], the BA[m] signal is driven high and the Acc#[m] signal is driven low, enabling the activation of the RAS#[m], SEN#[m] and PRC#[m] signals. The high state of the Mwr2 signal also enables the activation of the CAS2[m] column access signal in response to the global column access signal CAS#. The memory timing signals PAS#[m], SEN#[m], CAS2[m], and PRC#[m] are subsequently activated, thereby causing data on the WBO [127:0] bus to be written to memory bank [m] at the row and column designated by the entry address WBCA[6:0]. The logic high WBrd and WBret signals reset the valid bit in write valid memory 771 designated by the entry address WBCA[6:0]. (See, OR gate 713 and multiplexer 723 of FIG. 7.)

The third write access to address Ac[13:0] is detected at the rising edge of the Clk signal at the beginning of cycle T3. In response, the access address Ac[13:0] is latched into address register 304. The high state of the external Wen signal is latched by D-register 722 (FIG. 7), thereby driving the local write enable signal WEN high. The bank address Ac[13:7] (i.e., EBA[6:0]) is gated to bank address decoder 305 (FIG. 5), as well as to comparators 741–742 and the read and write buffer tag registers 762 and 772 in read-write tag controller 602 (FIG. 7).

Comparator 742 compares the bank address Ac[13:7] with the write buffer tag stored in write buffer tag memory 772. A non-match condition is detected, thereby causing the WBBHit and WBHit signals to remain low. The low state of the WBBHit signal causes the output of R-S register 833 (i.e., the WBret signal) to stay high. As a result, the data retiring process started during the previous clock cycle T2 continues. The high state of the WBret signal causes the Mwr1 signal to remain high (FIG. 9), thereby enabling a memory write cycle in memory bank [c], which is the designated bank of the write address Ac[13:0]. In memory bank [c], the logic high BA[c] and Mwr1 signals result in a logic low Acc#[c] signal, thereby enabling the timing control signals RAS#[c], SEN#[c] and PRC#[c] to follow their counterpart global control signals RAS#, SEN# and PRC#. The high state of the Mwr1 signal also allows column multiplexer control signal CAS1[c] to be activated in response to the CAS# signal. The activation of the memory timing signals causes the external data Dc to be written from the Di[127:0] bus to the location designated by the address Ac[6:0] in memory bank [c] through the memory read-write port 313. At the beginning of cycle T3, 7-bit counter 831 in FIG. 8 increases the value of the entry from 0 to 1, thereby setting up the row and column address for write buffer 310 and memory bank [m] (the target of the write buffer retiring). Assuming that the valid bit of entry 1 is also set, then the VB signal routed by multipleer 832 will have a logic high value. The logic high WBret and VB signals cause the WBrd and Mwr2 signals to stay high, thereby starting another read cycle in write buffer 310 and another write cycle in memory bank [m]. The operations timing signals RAS#[m], SEN# [m], and PRC#[m] in memory bank [m] and the operations timing signals RAS#[w], SEN#[w], and PRC#[w] in write buffer 310 closely follow the global timing signals RAS#, SEN#, and PRC# shown in FIG. 15. At the end of cycle T3, data WBD1 from entry 1 of write buffer 310 is read out to the bus WBO[127:0] and written to the same location in memory bank [m] through write-only port 312. Since memory bank [b] is not involved in the access during this period, nor is it involved in the retiring process, bank access enable signal BA[b] is low at this time. The low state of the BA[b] signal and the high state of the REFP[b] signal causes the REF[b] signal to go high (FIG. 11), thus enabling the RAS#[b], SEN#[b] and PRC#[b] signals to be activated by the global RAS#, SEN# and PRC# signals. In this manner, a refresh operation is performed in memory bank [b]. Since both the CAS1[b] and CAS2[b] signals stay low, the column switches 2011 (FIG. 10) are not enabled. The pending refresh signal REFP[b] is reset low at the end of the refresh cycle. The logic high WBrd and WBret signals reset the valid bit in write valid memory 771 designated by the entry address WBCA[6:0]. (See, OR gate 713 and multiplexer 723 of FIG. 7.)

The fourth write access to address Ad[13:0] is detected at the rising edge of the Clk signal at the beginning of cycle T4. In response, the access address Ad[13:0] is latched into address register 304. The high state of the external Wen signal is latched by D-register 722 (FIG. 7), thereby driving the local write enable signal WEN high. The bank address Ad[13:7] (i.e., EBA[6:0]) is gated to bank address decoder 305 (FIG. 5), as well as to comparators 741–742 and the read and write buffer tag registers 762 and 772 in read-write tag controller 602 (FIG. 7). As stated above, the fourth write access illustrates the termination of write buffer retiring when a write buffer hit occurs during the process of write buffer retiring.

The bank address Ad[13:7] is compared with the write buffer tag stored in write buffer tag memory 772. A match is detected, resulting in the activation of the write buffer bank hit signal WBBHit. Assuming the valid bit in write valid memory 771 designated by address Ad[6:0] is set, then the WBValid signal is driven high. The logic high WBValid and WBBHit signals result in a logic high WBHit signal. (See, AND gate 705 of FIG. 7.) The logic high WBBHit and WEN signals reset R-S register 833 (FIG. 8), thereby causing the WBret signal to go low. The logic low WBret signal terminates the write buffer retiring operation. The low WBret signal and the high WEN signal activate the write buffer write enable signal WBwr (see, AND gate 815 of FIG. 8), thereby enabling a write cycle in write data buffer 310. Input data Dd is written from the input data bus Di[127:0] to the write buffer entry designated by the address Ad[6:0]. The low state of the WBret signal suppresses the activation of the memory write signal Mwr1. As a result, no write operation is performed to memory blocks 1000–1127. The logic high WBwr signal, along with the logic low WBret signal asserts the WBVupdate signal. (See, AND gate 703 and OR gate 713 in FIG. 7.) In response, the valid bit designated by address Ad[6:0] in write valid memory 771 is set.

Write and Read Buffers Using DRAM

In the discussions for FIGS. 14 and 15 above, write buffer 310 and read buffer 311 are assumed to be fabricated from SRAM cells. In this case, write buffer 310 and read buffer 311 do not require a refresh operation. However, in another embodiment, write buffer 310 and read buffer 311 can be constructed using DRAM cells. In this embodiment, the area occupied by write buffer 310 and read buffer 311 is advantageously reduced. Because write buffer 310 and read buffer 311 have the same organization as memory blocks 1000–1127, write buffer 310 and read buffer 311 can be constructed using DRAM banks with minor modifications. These modifications have been described above in connection with the elements shown in dashed lines in FIGS. 5–13.

In this embodiment, write buffer 310 and read buffer 311 are refreshed in a manner similar to memory blocks 1000–1127. The refresh daisy chain output terminal REQO[1127] of memory block 1127 is connected to the refresh input terminal REQI[w] of write buffer 310. The daisy chain output terminal REQO[w] of write buffer 310 is connected to the refresh input terminal REQI [r] of read buffer 311. The daisy chain stops at read buffer 311, therefore the output terminal REQO[r] of read buffer 311 is not connected.

To ensure proper refresh in read buffer 311, refresh operations take precedence over external access operations. Therefore, when a refresh operation is pending, read buffer 311 ignores all external accesses to perform the pending refresh operation. When a refresh is pending in read buffer 311, the refresh pending signal REFP[r] is asserted high. The qualifier 'r' denotes that the signal is generated from read buffer 311. Signal REFP[r] is used in read-write buffer controller 601 to suppress the activation of the read buffer read enable signal RBrd and the read buffer write enable signal RBwr. (FIG. 8.) This is accomplished by connecting the REFP[r] signal to AND gates 812–814 as illustrated in dashed lines in FIG. 8. When the REFP[r] signal is driven high, outputs of AND gates 812–814 are driven low, thereby causing the RBrd and RBwr signals to go low. When read buffer 311 is busy performing a refresh operation, the designated memory bank has to handle the read access. Therefore, in memory read-write controller 603, the Mrd1 signal is activated when the REFP[r] and REN signals are activated high. The generation of the REFP[r] signal, and the control timing for operations in read buffer 311 is described above.

To maintain the data coherence in read buffer 311 when a write access hits read buffer 311 in collision with the read buffer refresh, the associated valid bit in read valid memory 761 is reset, thereby invalidating the data entry in read buffer 311. This invalidating operation is carried out by read-write tag controller 602. (FIG. 7) When the REFP[r], RBHit and WEN signals all have logic high values, AND gate 702 provides a logic high signal to OR gate 712, thereby resulting in a logic high RBVupdate signal. This logic high RBVupdate signal resets the valid bit designated by the address in ERC[6:0].

To ensure proper refresh in write buffer 310, a refresh operation has priority over all other operations except for a read hit to write buffer 310 that misses read buffer 311 or when a refresh is pending in read buffer 311. When this occurs, the refresh operation of write buffer 310 is delayed. In the worst case, this can occur in 129 consecutive clock cycles when a continuous stream of accesses hits write buffer 310, traversing all the addresses in write buffer 310, and read buffer 311 performs a refresh operation during this time. Note that, if there is no change in the bank address during a stream of accesses, two accesses to the same location cannot cause two read buffer misses unless a refresh operation is performed in read buffer 311 during one of the access. If the proper refresh period is longer than 129 clock cycles, then refresh operation can be performed in write buffer 310 within the proper refresh period. When a refresh is pending in write buffer 310, the REFP[w] signal is asserted high. In read-write buffer control 601 (FIG. 8), the high state of the REFP[w] signal causes the write buffer write enable signal WBwr to stay low, thereby suppressing any write access to write buffer 310 during write data buffer refresh.

When write buffer 310 is handling the refresh, the designated memory bank must handle the write access. Therefore, the Mwr1 signal is activated when the REFP[w] and WEN signals are high. (See, AND gate 905 and OR gate 912 of FIG. 9.)

Another operation that write buffer refresh can affect is write data retiring. During write buffer retiring, the refresh operation in write buffer 310 suspends data retiring for one clock cycle. After the refresh operation, data retiring is resumed. This is accomplished by the logic shown in FIGS. 8 and 9. In FIG. 8, the high state of the REFP[w] signal causes the output of AND gate 819 to go low, which in turn causes the WBrd signal to go low, thereby suppressing the read operation in write buffer 310 that is induced by write data retiring. The memory write operation induced by write buffer retiring is suppressed inverting the REFP[w] signal and providing the result to AND gate 903. (FIG. 9.) A high REFP[w] signal thereby causes the Mwr2 signal to stay low. A logic high REFP[w] signal also drives input INC of counter 831 low, thereby suspending the incrementing of counter 831 during write buffer retiring.

Although the invention has been described in connection with several embodiments, it is understood that this invention is not limited to the embodiments disclosed, but is capable of various modifications which would be apparent to a person skilled in the art. For example, the DRAM banks and the SRAM cache memory can have different sizes in different embodiments. Similarly, different numbers of DRAM banks can be used. Moreover, buses having different widths than those described can be used in other embodiments. In addition, the proper refresh period can be increased by incorporating a refresh accumulator in each memory bank. Moreover, write data masking can be added with minor modifications to the write control in the memory banks, the read and write data buffers and the write buffer valid bits. Thus, the invention is limited only by the following claims.

What is claimed is:

1. A method of operating a memory system having a plurality of memory banks constructed using memory cells that require periodic refreshing, the method comprising the steps of:
   writing data from one of the memory banks to a read buffer if an external read access misses the read buffer;
   writing external data to the read buffer when an external write access hits the read buffer; and
   reading data from the read buffer when an external read access hits the read buffer.

2. The method of claim 1, further comprising the steps of:
   writing external data to a write buffer when an external write access hits the write buffer;
   retiring data from the write buffer to one of the memory banks through a first port when an external write access misses the write buffer; and
   writing external data to one of the memory banks through a second port when an external write access misses the write buffer.

3. The method of claim 2, further comprising the step of enabling a refresh operation in a memory bank addressed by an external write access when an external write access hits the write buffer or the read buffer.

4. The method of claim 2, wherein the first port is a write-only port, and the second port is a read-write port.

5. The method of claim 2, further comprising the step of delaying a refresh operation in a memory bank addressed by an external write access that misses the write buffer until there is no longer an external access to this bank.

6. The method of claim 2, further comprising the step of delaying a refresh operation in a memory bank when data is being retired from the write buffer to the memory bank.

7. The method of claim 2, further comprising the steps of:
   stopping the step of retiring data from the write buffer to one of the memory banks if an external write access hits the write buffer during the step of retiring data; and then
   writing external data associated with the external write access to the write buffer.

8. The method of claim 2, further comprising the steps of:
   reading data from the write buffer when an external read access hits the write buffer and misses the read buffer; and simultaneously
   writing the data read from the write buffer to the read buffer.

9. The method of claim 1, further comprising the step of enabling a refresh operation to the read buffer only if there is no pending access to the read buffer.

10. A method of operating a memory system having a plurality of memory banks constructed using memory cells that require periodic refreshing, the method comprising the steps of:
    writing external data to a write buffer when an external write access hits the write buffer;
    retiring data from the write buffer to one of the memory banks through a first port when an external write access misses the write buffer; and
    writing external data to one of the memory banks through a second port when an external write access misses the write buffer.

11. The method of claim 10, further comprising the step of enabling a refresh operation in a memory bank addressed by an external write access when an external write access hits the write buffer.

12. The method of claim 10, wherein the first port is a write-only port, and the second port is a read-write port.

13. The method of claim 10, further comprising the step of delaying a refresh operation in a memory bank addressed by an external write access that misses the write buffer until there is no longer an external access to this bank.

14. The method of claim 10, further comprising the step of delaying a refresh operation in a memory bank when data is being retired from the write buffer to the memory bank.

15. The method of claim 10, further comprising the steps of:
    stopping the step of retiring data from the write buffer to one of the memory banks if an external write access hits the write buffer during the step of retiring data; and then
    writing external data associated with the external write access to the write buffer.

16. The method of claim 10, further comprising the steps of:
    reading data from the write buffer when an external read access hits the write buffer and misses a read buffer; and simultaneously
    writing the data read from the write buffer to the read buffer.

* * * * *